(12) United States Patent
Okamura et al.

(10) Patent No.: US 9,001,881 B2
(45) Date of Patent: Apr. 7, 2015

(54) WIRELESS POWER AND DATA TRANSMISSION SYSTEM, POWER TRANSMITTING APPARATUS, AND POWER RECEIVING APPARATUS

(75) Inventors: Shutai Okamura, Cupertino, CA (US); Keisuke Kinoshita, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 330 days.

(21) Appl. No.: 13/465,171

(22) Filed: May 7, 2012

(65) Prior Publication Data

US 2012/0287985 A1 Nov. 15, 2012

(30) Foreign Application Priority Data

May 9, 2011 (JP) ................................. 2011-103989
Apr. 5, 2012 (JP) ................................. 2012-086775

(51) Int. Cl.
| | |
|---|---|
| *H03K 7/08* | (2006.01) |
| *H04L 25/49* | (2006.01) |
| *H04L 25/02* | (2006.01) |
| *H03F 3/217* | (2006.01) |
| *H03F 3/24* | (2006.01) |

(52) U.S. Cl.
CPC ............ *H04L 25/4902* (2013.01); *H04L 25/02* (2013.01); *H03F 3/2176* (2013.01); *H03F 3/245* (2013.01); *H03K 7/08* (2013.01)

(58) Field of Classification Search
CPC ... H04L 25/4902; H04L 25/02; H03F 3/2176; H03F 3/245; H03K 7/08
USPC .......................... 375/238, 259, 295, 300, 350
See application file for complete search history.

(56) References Cited

U.S. PATENT DOCUMENTS

| | | | |
|---|---|---|---|
| 4,388,716 | A | 6/1983 | Takezoe et al. |
| 4,646,221 | A | 2/1987 | Sekino et al. |
| 6,169,670 | B1 | 1/2001 | Okubo et al. |
| 6,771,121 | B2 | 8/2004 | Nilsson et al. |
| 7,834,307 | B2 | 11/2010 | Tanizawa |
| 2001/0024441 | A1 | 9/2001 | Bateman et al. |
| 2002/0093714 | A1 | 7/2002 | Tokita et al. |
| 2003/0039313 | A1 | 2/2003 | Inoue et al. |

(Continued)

FOREIGN PATENT DOCUMENTS

| | | |
|---|---|---|
| JP | 58-101591 A | 6/1983 |
| JP | 61-039708 A | 2/1986 |

(Continued)

OTHER PUBLICATIONS

Imura et al., "Proposal of Wireless Power Transfer via Magnetic Resonant Coupling in kHz-MHz-GHz", The 2010 Proceedings of the Institute of Electronics, Information and Communication Engineers, BS-9-5, Mar. 2010 and concise explanation.
Co-pending U.S. Appl. No. 13/465,183, filed May 7, 2012.

*Primary Examiner* — Syed Haider
(74) *Attorney, Agent, or Firm* — Renner, Otto, Boisselle & Sklar, LLP

(57) ABSTRACT

A power transmitting apparatus is usable for wireless power and data transmission. The power transmitting apparatus includes a power transmitting section configured to transmit power and data to be transmitted as being converted into a pulse train; and a control section configured to control the power transmitting section such that a change of the power caused by superimposition of the data is decreased.

15 Claims, 13 Drawing Sheets

(56) References Cited

U.S. PATENT DOCUMENTS

| | | | |
|---|---|---|---|
| 2003/0107440 A1* | 6/2003 | Miki et al. | 330/297 |
| 2007/0009052 A1 | 1/2007 | Hershbarger et al. | |
| 2008/0197802 A1 | 8/2008 | Onishi et al. | |
| 2009/0302800 A1* | 12/2009 | Shiozaki et al. | 320/108 |
| 2010/0141042 A1 | 6/2010 | Kesler et al. | |
| 2010/0329385 A1* | 12/2010 | Suematsu et al. | 375/295 |

FOREIGN PATENT DOCUMENTS

| | | |
|---|---|---|
| JP | 08-265308 A | 10/1996 |
| JP | 2004-312594 A | 11/2004 |
| JP | 2006-245345 A | 9/2006 |
| JP | 2007-088999 A | 4/2007 |
| JP | 2008-206233 A | 9/2008 |
| JP | 2008-206305 A | 9/2008 |
| JP | 2009-153056 A | 7/2009 |

* cited by examiner

FIG.9
(a) WHEN THE VALUE OF FL DATA IS 0
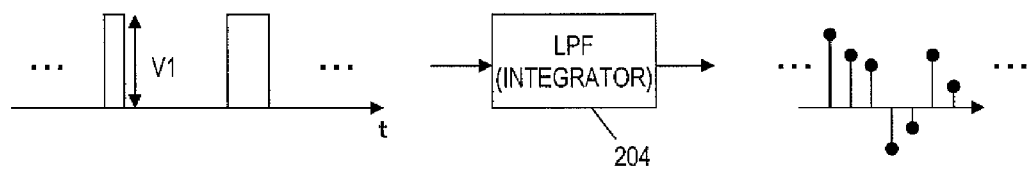
(b) WHEN THE VALUE OF FL DATA IS 1
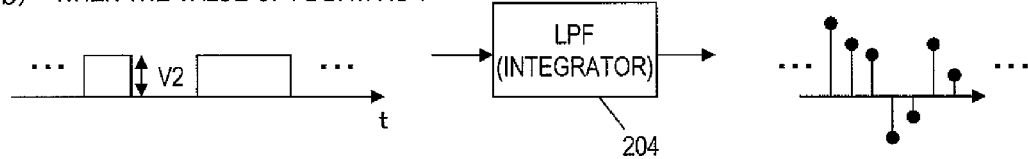
FIG.10
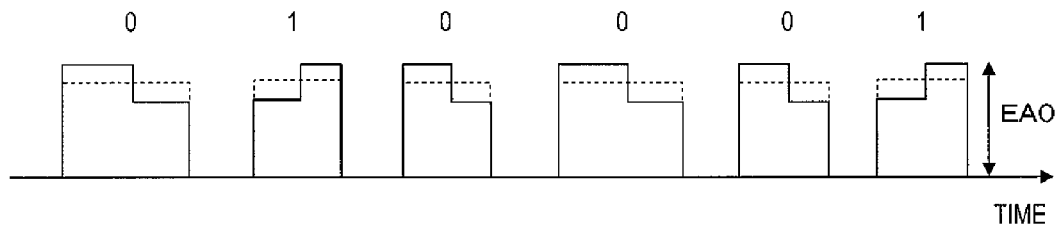

| FL DATA | RL DATA | PULSE WIDTH CORRECTION VALUE | DRIVING VOLTAGE | POST-AMPLIFICATION PWM PULSE AMPLITUDE |
|---|---|---|---|---|
| N/A | N/A | 0 | Vdd0 | EA0 |
| 0 | N/A | P1 | Vdd1 | EA1 |
| 1 | N/A | P2 | Vdd2 | EA2 |
| N/A | 0 | PR | Vdd0 | EA0 (AVERAGE VALUE) |
| N/A | 1 | PR | Vdd0 | EA0 (AVERAGE VALUE) |

WIRELESS POWER AND DATA TRANSMISSION SYSTEM, POWER TRANSMITTING APPARATUS, AND POWER RECEIVING APPARATUS

BACKGROUND OF THE INVENTION

1. Field of the Invention

The present invention relates to a wireless power and data transmission system for transmitting electric power and data, a power transmitting apparatus, and a power receiving apparatus.

2. Description of the Related Art

It has been attempted to transfer electric power necessary to operate an electric device wirelessly or in a non-contact manner (contactlessly). For example, in the fields of electric shavers, electric tooth brushes and the like, products adopting a wireless power transfer method using the principle of electromagnetic induction described in Japanese Laid-Open Patent Publication No. 2008-206233 (hereinafter, such a wireless power transmission method will be referred to as an "electromagnetic induction method") have been put on the market and have successfully improved the convenience for users.

Recently, a wireless power transmission method using the resonance phenomenon in an electromagnetic field are known (e.g., U.S. Laid-Open Patent Publication No. 2010/0141042). This wireless power transmission method has advantages that the transfer distance is extended and that the degree of freedom in the relative locations of a power transmitting device and a power receiving device can be improved as compared with the electromagnetic induction method. This wireless power transmission technology also referred to as the resonant magnetic coupling method has been currently on research and development, and wireless power transmission is expected to be applied in a wider range of fields.

According to the resonance magnetic coupling method, a power transmitting device and a power receiving device each include a resonator. Only when the resonance frequency of the resonator in the power transmitting device (transmitting-side resonator) and the resonance frequency of the resonator in the power receiving device (receiving-side resonator) match each other, power is transferred from the transmitting side to the receiving side by use of the resonance phenomenon.

In general, the efficiency of the wireless power transfer is in proportion to kQ, which is the product of the coupling coefficient k between the transmitting-side resonator and the receiving-side resonator and the Q factor (Quality Factor) of the resonators. Generally for the resonant magnetic coupling method, resonators having the Q factor in the order of several thousands are used. Owing to this, even when the coupling coefficient k is small because the power transmitting device and the power receiving device are away from each other by a long distance or because the axis of the coil of the transmitting-side resonator and the axis of the coil of the receiving-side resonator are shifted from each other, a high power transfer efficiency can be achieved.

According to the resonant magnetic coupling method, as disclosed in Takehiro IMURA et al., "Proposal of Wireless Power Transfer via Magnetic Resonant Coupling in kHz-MHz-GHz", The 2010 Proceedings of The Institute of Electronics, Information and Communication Engineers, BS-9-5, March 2010, the resonance frequency of the resonators can be set to any frequency. It is now assumed that the resonators are designed by use of a frequency in the band of several tens of megahertz as the resonance frequency, such that the 3 dB bandwidth of the frequency characteristic of the resonators is several hundred kilohertz to several megahertz. In this case, data communication can be made in which a magnetic carrier wave for power transfer is modulated with data having a transfer rate of several hundred kilobits per second to several megabits per second. In this manner, overlay transfer of power and data can be realized. Hereinafter, such transmission will be referred to as "wireless power and data transmission".

An example of data transferred by means modulation of a magnetic carrier wave is an audio signal. An audio signal is in a band of 20 Hz to 20 kHz, and therefore can be sufficiently transferred by wireless power and data transmission by the resonant magnetic coupling method using a band of several tens of megahertz. Japanese Laid-Open Patent Publication No. 2009-153056 discloses an example of wireless power and data transmission of an audio signal. A system disclosed in Japanese Laid-Open Patent Publication No. 2009-153056 includes a power transmitting apparatus for performing AM (Amplitude Modulation) modulation on a magnetic carrier wave used for wireless power transfer and transferring the resultant magnetic carrier wave, and a power receiving apparatus for receiving an audio signal having a sufficiently level of power to drive a speaker from the magnetic carrier wave transmitted from the power transmitting apparatus. By use of the power transmitting apparatus and the power receiving apparatus disclosed in Japanese Laid-Open Patent Publication No. 2009-153056, a wireless speaker apparatus which does not need a power supply such as a batter or the like is realized.

According to the wireless power transfer system disclosed in Japanese Laid-Open Patent Publication No. 2008-206233, data which authenticates that the power transmitting device and the power receiving device are both proper devices is transferred together with the power. Owing to such a structure, power transmission to an unauthorized power receiving device, to a power receiving device which does not need power, an item other than a receiving device or the like can be avoided. Therefore, the safety of wireless power transfer is improved.

Japanese Laid-Open Patent Publication No. 2008-206305 discloses a power transmitting apparatus for transmitting 0 and 1 of binary data as being distinguished from each other by using different frequencies for the magnetic carrier wave for 0 and 1. The frequency characteristics of resonators are frequency-selective with the resonance frequency fo being the peak. Therefore, when the frequency of a magnetic carrier wave is changed, the amplitude of the magnetic carrier wave is also changed. A power receiving apparatus disclosed in Japanese Laid-Open Patent Publication No. 2008-206305 can transmit 0 and 1 of binary data to the power transmitting apparatus as being distinguished from each other by use of an amplitude change of the magnetic carrier wave which is caused by a switch on the load of the power receiving circuit (load modulation).

In order to realize the above-described wireless power and data transmission, data such as an audio signal, control information or the like needs to be transferred by use of a magnetic carrier wave for transmitting power. Now, a case where, as in the apparatus described in Japanese Laid-Open Patent Publication No. 2009-153056, a magnetic carrier wave for power transfer is AM-modulated with an audio signal will be discussed. When the magnetic carrier wave which has been AM-modulated is further modulated with data such as a control signal or the like by the power transmitting device, the amplitude of the magnetic carrier wave is changed. As a result, a problem occurs that the sound reproduced by the receiving-side speaker is changed in the volume, is distorted, or includes noise.

This problem is not limited to a system for transmitting an audio signal to a speaker, and occurs in substantially the same manner in any system for transmitting data as being overlaid on power. Namely, there is a problem that when the magnetic carrier wave is modulated with data to be transmitted, the amplitude of the power received by the power receiving device is changed, which destabilizes the power transfer.

SUMMARY OF THE INVENTION

A power transmitting apparatus according to an embodiment of the present invention is usable for wireless power and data transmission. The power transmitting apparatus includes a power transmitting section configured to transmit a pulse train including a plurality of pulses on which power and data to be transmitted are superimposed; and a control section configured to control the power transmitting section such that a change of the power caused by a superimposition of the data is decreased.

In one embodiment, the control section changes an amplitude of the pulse train in accordance with a value of the data, and in synchronization with the change of the amplitude, changes a pulse width of the pulse train such that the change of the power to be transmitted caused by the change of the amplitude is decreased.

In one embodiment, the control section changes an amplitude of the pulse train in accordance with a value of the data, and in synchronization with the change of the amplitude, changes a pulse width of the pulse train such that an area size of the pulse train is kept constant.

In one embodiment, the power transmitting section includes a pulse width modulator configured to output a first pulse train having a pulse width determined based on an instruction from the control section; a pulse amplitude modulator configured to output a second pulse train obtained by amplifying the first pulse train as the pulse train; and a resonator configured to transmit power and data based on the second pulse train. The control section controls the pulse width modulator and the pulse amplitude modulator such that an amplitude and a pulse width of the second pulse train are changed in accordance with a value of the data.

In one embodiment, the pulse amplitude modulator includes an amplifier configured to amplify the first pulse train with an input driving voltage and thus generating the second pulse train; and the control section switches the driving voltage to be input to the amplifier in accordance with the value of the data, and thus changes the amplitude of the second pulse train.

In one embodiment, the power transmitting section includes a pulse width modulator configured to output a first pulse train having a pulse width determined based on an instruction from the control section; a pulse—amplitude modulator configured to output a second pulse train that has a frequency determined based on an instruction from the control section and is obtained by amplifying the first pulse train, as the pulse train; and a resonator configured to transmit power and data based on the second pulse train. The control section changes a frequency of the first pulse train in accordance with the value of the data, and controls the pulse width modulator such that a pulse width of the first pulse train is changed.

In one embodiment, when the data has a first value, the control section sets the frequency of the first pulse train to a first frequency that is substantially equal to a resonance frequency of the resonator; and when the data has a second value, the control section sets the frequency of the first pulse train to a second frequency that is different from the first frequency.

In one embodiment, the power transmitting section includes a pulse width modulator configured to output a first pulse train having a pulse width determined based on an instruction from the control section; a pulse amplitude modulator configured to output a second pulse train, obtained by amplifying the first pulse train output from a frequency modulation section, as the pulse train; and an antenna including at least one resonator configured to transmit power and data based on the second pulse train. The control section controls the antenna such that a resonance frequency is changed and controls the pulse width modulator such that a pulse width of the first pulse train is changed.

In one embodiment, when the data has a first value, the control section sets the resonance frequency to a first frequency that is substantially equal to a frequency of the first pulse train; and when the data has a second value, the control section sets the resonance frequency to a second frequency that is different from the first frequency.

In one embodiment, the at least one resonator includes a plurality of resonators having different resonance frequencies; and the control section selects one of the plurality of resonators and thus changes a resonance frequency of the antenna.

In one embodiment, when the data is first data, the power transmitting section amplifies second data by means of pulse width modulation and thus converts the power, the first data and the second data into the pulse train and transmits the pulse train.

In one embodiment, the control section controls the power transmitting section such that an amplitude and a pulse width of the pulse train are changed in accordance with a value of the data at a timing at which the second data is not pulse-width-modulated.

In one embodiment, the control section controls the power transmitting section such that the power transmitting section performs addition or subtraction of a correction value in accordance with a value of the second data on the pulse width based on the second data and thus determines a pulse width of the pulse train.

In one embodiment, while not performing pulse width modulation on the second data, the power transmitting section outputs a synchronization pulse including a first transmission period in which a pulse having a first duty ratio is output and a second transmission period in which a pulse having a second duty ratio is output.

In one embodiment, the first duty ratio is 50%, and the second duty ratio is 0%.

A wireless power and data transmission system according to an embodiment of the present invention is for wirelessly transmitting power and data. The wireless power and data transmission system includes a power transmitting apparatus configured to transmit the power and the data; and a power receiving apparatus configured to receive the power and the data transmitted from the power transmitting apparatus. The power transmitting apparatus is any of the above-described power transmitting apparatuses.

According to an embodiment of the present invention, when power and data are wirelessly transferred, distortion or noise included in a signal received by a power receiving device can be reduced.

Other features, elements, processes, steps, characteristics and advantages of the present invention will become more apparent from the following detailed description preferred embodiments of the present invention with reference to the attached drawings.

BRIEF DESCRIPTION OF THE DRAWINGS

FIG. 9 shows that the level of an audio signal is maintained by a change of the pulse width.

FIG. 10 shows a pulse amplitude that is changed by load modulation.

DETAILED DESCRIPTION OF PREFERRED EMBODIMENTS

Before describing specific embodiments of the present invention, a basic structure of an embodiment of the present invention will be described.

Figure 1A:
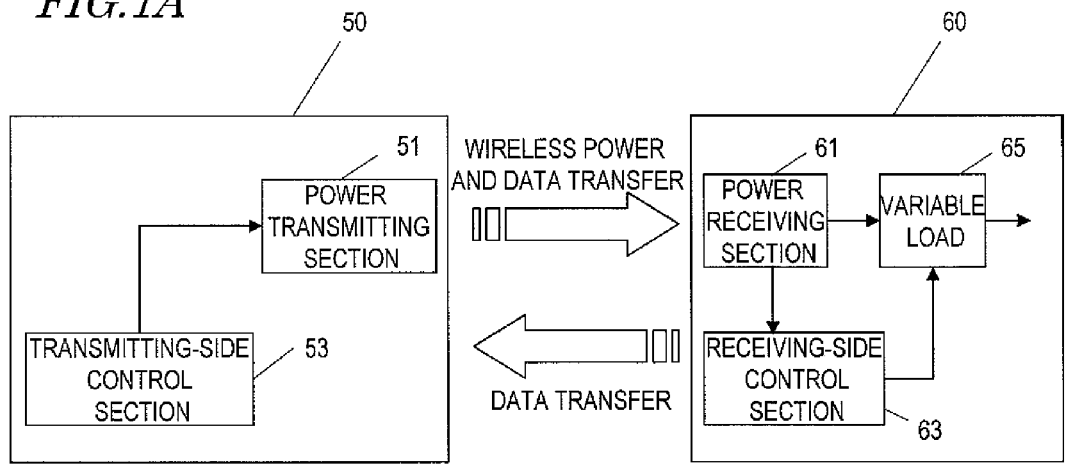
FIG. 1A shows a basic structure of a wireless power and data transmission system according to an embodiment of the present invention.

FIG. 1A is a block diagram showing an example of basic structure of a wireless power and data transmission system according to an embodiment of the present invention. The system includes a power transmitting apparatus (power transmitting device) 50 and a power receiving apparatus (power receiving device) 60. In this system, electric power and data can be transferred from the power transmitting apparatus 50 to the power receiving apparatus 60, and also data can be transferred from the power receiving apparatus 60 to the power transmitting apparatus 50.

The power transmitting apparatus 50 includes a power transmitting section 51 for transmitting power and data as being converted into a pulse train, and a transmitting-side control section 53 for controlling an operation of the power transmitting section 51. The transmitting-side control section 53 controls the power transmitting section 51 such that an amplitude of the pulse train is changed in accordance with a value of data to be transmitted. As a result, the data can be transmitted to the power receiving apparatus 60 by means of modulation performed on the amplitude of the pulse train. However, when only the amplitude of the pulse train is modulated, the level of power transferred to the power receiving apparatus 60 is varied. As a result, the wireless power transfer may be destabilized. Hence, the transmitting-side control section 53 changes the amplitude of the pulse train and also changes a pulse width of the pulse train. In this manner, the level of power transferred is suppressed from varying and thus the operation can be kept stable.

The power receiving apparatus 60 includes a power receiving section 61 for receiving power and data based on the pulse train sent from the power transmitting section 51, a variable load 65 for consuming the received power, and a receiving-side control section 63 for controlling a load value of the variable load 65 based on the received pulse train. The power receiving apparatus 60 generates data to be transferred to the power transmitting apparatus 50 by varying the load value of the variable load 65. Specifically, when the power receiving section 61 receives the power converted into the pulse train from the power transmitting section 51, the receiving-side control section 63 changes the load value of the variable load 65 in accordance with the value of the data to be transmitted. The receiving-side control section 63 changes the variable load 65 such that the value of each of pulses included in the pulse train is changed during the time duration of the pulse. As a result of such control, the electric current flowing on the circuit in the power transmitting apparatus 50 and the electric voltage thereof are varied. Therefore, when the variation is detected, the data sent from the power receiving apparatus 60 can be detected.

While the power receiving apparatus 60 is transferring data to the power transmitting apparatus 50, the amplitude of the pulses is varied. Therefore, the power transfer may be undesirably destabilized. Hence, in one embodiment, while the power receiving apparatus 60 is transferring data to the power transmitting apparatus 50, the transmitting-side control section 53 adjusts the pulse width of the pulse train that is being transferred. Owing to this, during the data transfer from the power receiving apparatus 60 also, a stable operation can be realized.

As described above, in the embodiment of the present invention, when transferring data together with power wirelessly, the power transmitting apparatus 50 realizes a stable operation by adjusting the amplitude and the pulse width of the pulse train that is being transferred. By contrast, the power receiving apparatus 60 transmits data to the power transmitting apparatus 50 by changing the load value of the variable load 65. Owing to such a structure, for example, the power transmitting apparatus 50 can send control information such as authentication of a device or notification of transfer to the power receiving apparatus 60, and the power receiving apparatus 60 can send information on a response thereto to the power transmitting apparatus 50.

Aside from such control information, the power transmitting apparatus 50 may transfer any other type of data in an overlaying manner. For example, as described later, the power transmitting apparatus 50 may transfer data such as an audio signal or the like by use of pulse width modulation together with power and control information.

Hereinafter, specific embodiments of the present invention will be described. In the following description, identical or corresponding elements bear the same reference numerals.

Embodiment 1

First, Embodiment 1 according to the present invention will be described. This embodiment is directed to a wireless speaker apparatus for wirelessly transferring power and data. Hereinafter, first, a basic structure for transferring power for driving a speaker and an audio signal from a power transmitting device to a power receiving device at the same time will be described. Next, an example of structure for transmitting and receiving a control signal for authentication of a device or the like between the power transmitting device and the power receiving device will be described. In this embodiment, a resonant magnetic coupling method is adopted as the wireless power transfer method. However, the wireless power transfer method is not limited to this method, and any other method such as an electromagnetic induction method or the like may be adopted. In this embodiment, audio data is transferred, but in the case where any other type of data is transferred, substantially the same structure may be used.

<1-1. Basic Structure (Transfer of Power and Audio Signal)>

First, the basic structure will be described by way of a wireless speaker apparatus (wireless power and data transmission system) for transferring power for driving a speaker and an audio signal from a power transmitting device to a power receiving device by means of wireless power and data transmission using the resonant magnetic coupling method.

Figure 1B:
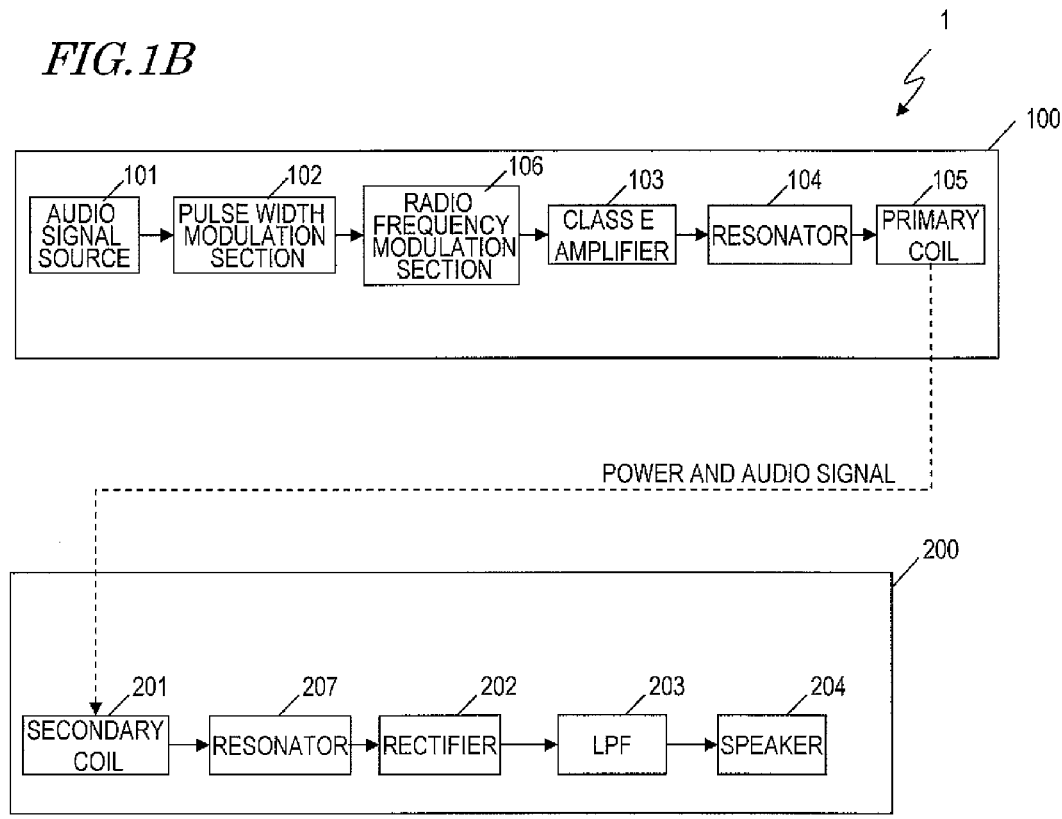
FIG. 1B shows a structure of a wireless power and data transmission system according to Embodiment 1.

FIG. 1B is a block diagram showing a structure of wireless power and data transmission system 1 in this embodiment. The wireless power and data transmission system includes a power transmitting device 100 and a power receiving device 200.

The power transmitting device 100 includes an audio signal source 101, a pulse width modulation section 102, a radio frequency modulation section 106, a class E amplifier 103, a resonator 104, and a primary coil 105. The power receiving device 200 includes a secondary coil 201, a resonator 207, a rectifier 202, an LPF 203, and a speaker 204. Although not shown in FIG. 1B, the power transmitting device 100 is supplied with power by an AC power supply or a DC power supply such as a battery or the like, or by wireless power transfer from another wireless power transfer system (not shown).

The wireless power and data transmission system 1 shown in FIG. 1B transfers power and an audio signal from the power transmitting device 100 to the power receiving device 200 by use of pulse width modulation (PWM) as a transfer format of the audio signal. Pulse width modulation is a modulation method of transferring a value of an audio signal as being modulated into a pulse width, and has a feature of transferring an audio signal at binary amplitude levels. Therefore, pulse width modulation can use an amplifier such as the class E amplifier 103, which uses a saturation region of a transistor for signal amplification. This decreases the size and the power consumption of the circuit. When pulse width modulation is used for an audio signal format in wireless power transfer for transferring an audio signal in an overlaying manner, high quality audio signal transfer with little distortion can be realized.

The wireless power and data transmission system 1 uses a resonant magnetic coupling type power transfer method as a method for transferring power and an audio signal from the power transmitting device 100 to the power receiving device 200. According to the resonant magnetic coupling type power transfer method, when a resonator having a high Q factor is used, high efficiency power transfer can be performed even when the coupling coefficient k is small as in the case where the distance between the power transmitting device 100 and the power receiving device 200 is long.

The wireless power and data transmission system 1 transfers a pulse-width-modulated audio signal and power by means of coupling of a resonant magnetic field generated between the primary coil 105 and the secondary coil 201.

Hereinafter, each of the elements included in the power transmitting device 100 and the power receiving device 200 will be described. First, each of the elements included in the power transmitting device 100 will be described.

The audio signal source 101 is a circuit for generating an analog or digital audio signal and sending the signal to the pulse width modulation section 102. The audio signal source 101 generates an audio signal based on, for example, a signal acquired from a storage medium (not shown) or from a transfer medium such as a radio wave or the like.

The pulse width modulation section 102 is a circuit for performing pulse width modulation on the audio signal input from the audio signal source 101. The pulse width modulation section 102 includes, for example, a processor such as an LSI, a DSP, an FPGA or the like. The pulse width modulation section 102 outputs a pulse train having a width modulated in accordance with the size of the audio signal as a result of the pulse width modulation (hereinafter, such a pulse train may be referred to as a "PWM pulse"). More specifically, when the input signal is an analog audio signal, the pulse width modulation section 102 compares the input signal against a reference wave having a prescribed cycle and amplitude, such as a triangular wave or a sawtooth wave, to convert the input signal into a pulse train having a width in accordance with the value of the input signal, and outputs the resultant pulse train. By contrast, when the input signal is a digital audio signal, the pulse width modulation section 102 modulates a pulse width of the input signal by digital processing described later.

The radio frequency modulation section 106 is an oscillation circuit, connected to the pulse width modulation section 102, for modulating the PWM pulse to have a radio frequency that is the same as a resonance frequency f0 (e.g., several megahertz to several tens of megahertz) of the resonator 104. The pulse train modulated to have a radio frequency (hereinafter, may be referred to as a "radio frequency PWM pulse") is sent to the class E amplifier 103.

The class E amplifier 103 is an amplification circuit for amplifying the radio frequency PWM pulse output from the radio frequency modulation section 106 and outputting the resultant pulse. The class E amplifier 103 has, for example, a structure shown in FIG. 2. The class E amplifier 103 includes a switching element Tr formed of a transistor such as a MOSFET or the like, inductors Lc, L and L0, and capacitors C and C0. The inductors L and L0 and the capacitor C0 form a series resonant circuit having the same resonance frequency as the resonance frequency f0 of the resonator 104. The switching element Tr, the capacitor C and the series resonant circuit (L, L0 and C0) are connected parallel to the inductor Lc.

Figure 2:
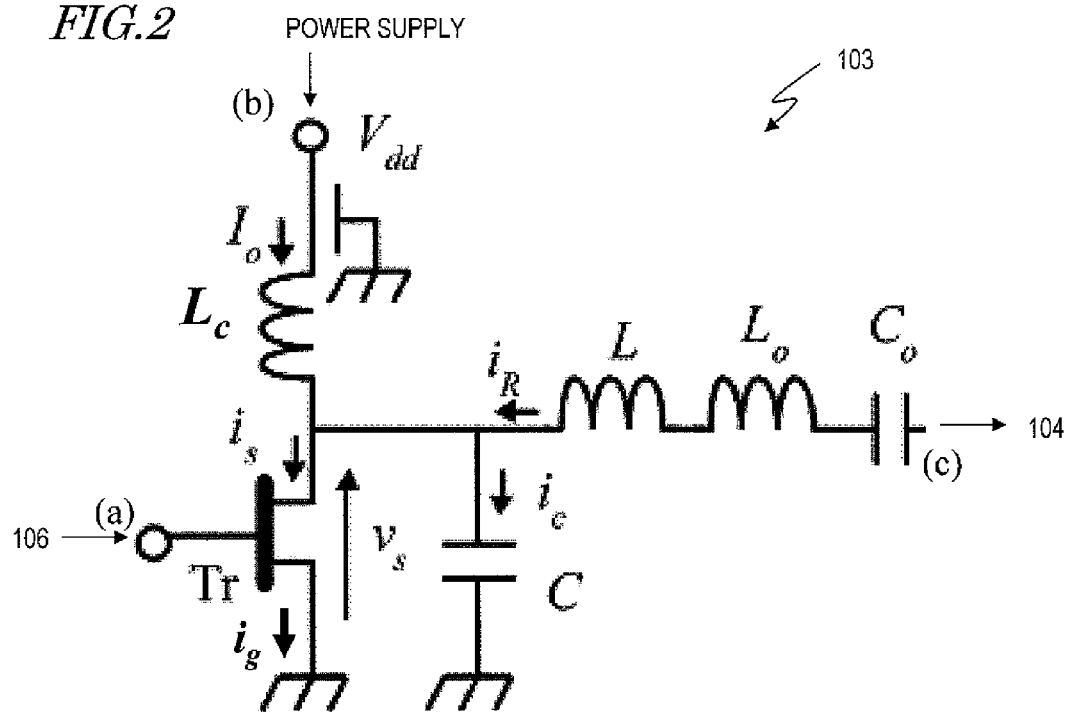
FIG. 2 shows a structure of a class E amplifier 103.

Referring to FIG. 2, to a terminal (a), the radio frequency PWM pulse is input from the radio frequency modulation section 106. To a terminal (b), a driving voltage Vdd is input from an external DC power supply (not shown). By application of the radio frequency PWM pulse having a frequency of f0 to a gate of the switching element Tr, the DC power supplied from the DC power supply can be converted into radio frequency (RF) power having a frequency of f0. As a result, the pulse train amplified to have power necessary for power transfer is output from a terminal (c) and sent to the resonator 104.

The amplification circuit to be used is not limited to a class E amplification circuit, and may be any other amplification circuit which utilizes the switching principle of transistors. For example, a class D amplification circuit or a class F amplification circuit, which is generally referred to as a "switching amplifier" or a "saturating amplifier" is usable in substantially the same manner.

The resonator 104 is an LC resonant circuit having the resonance frequency f0. The resonator 104 includes an inductor and a capacitor. The capacitor may be preferably formed of a copper or silver conductor having a high conductivity. As the capacitor, any type of element having, for example, a chip shape or a lead shape is usable. The resonator 104 forms a resonant magnetic field having frequency of f0 in a space via the primary coil 105.

The primary coil 105 is an element for transmitting the power and the data based on the amplified pulse train to the space. There is no specific limitation on the shape of the primary coil 105, and the primary coil 105 may have any known shape such as a loop shape or a spiral shape. The size of the primary coil 105 depends on the transfer distance or the power to be transferred, and is set to, for example, several centimeters to several tens of centimeters.

Now, each of the elements included in the power receiving device 200 will be described.

The secondary coil 201 has substantially the same structure and shape as those of the primary coil 105 in the power transmitting device 100.

The resonator 207 is a resonant circuit having the same resonance frequency as that of the resonator 104 on the transmitting side. The resonator 207 receives the power from the resonant magnetic field formed by the primary coil 105 via the secondary coil 201.

The rectifier 202 is a rectification circuit for converting the power received by the resonator 207 into DC power. There is no specific limitation on the structure of the rectifier 202, and the rectifier 202 may have any known structure. The DC power rectified by the rectifier 202 is sent to the low pass filter (LPF) 203.

The LPF 203 is a low pass filter for removing a radio frequency band component of the input signal. By removal of the high frequency band component from the received pulse train, an audio signal is generated. The generated audio signal is input to, and reproduced by, the speaker 204.

Hereinafter, an operation of the wireless power and data transmission system 1 for transferring power and an audio signal will be described.

The audio signal source 101 in the power transmitting device 100 outputs the audio signal, to be reproduced by the speaker 204 in the power receiving device 200, to the pulse width modulation section 102. The audio signal source 101 outputs an analog audio signal, or a digital audio signal represented by a sampling frequency fs and a quantization bit rate bq, to the pulse width modulation section 102 as an output signal. The pulse width modulation section 102 performs pulse width modulation on the audio signal input from the audio signal source 101.

Figure 3:
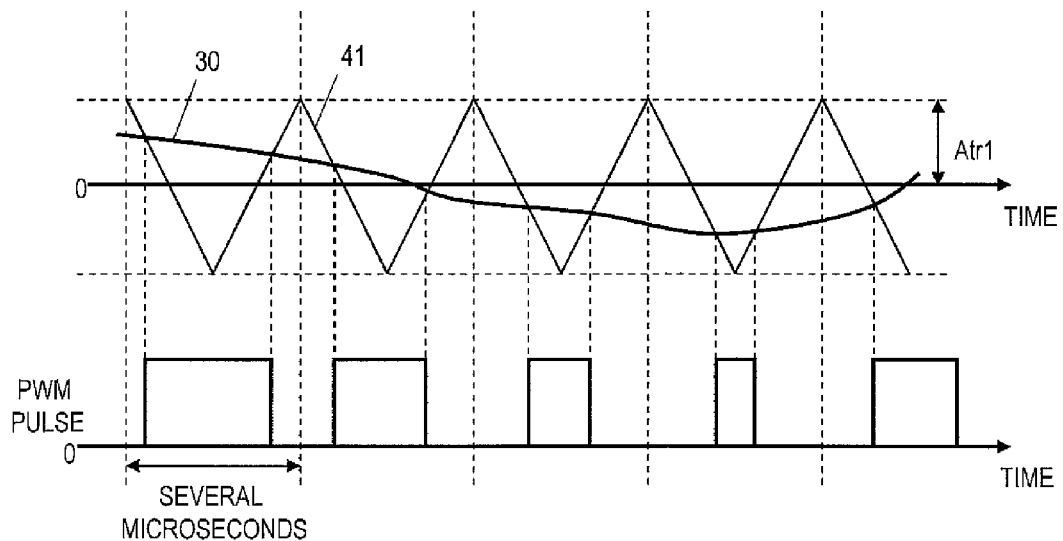
FIG. 3 shows an example of pulse width modulation.

First, an example of processing performed by the pulse width modulation section 102 when the audio signal source 101 outputs an analog audio signal will be described. FIG. 3 shows an example of pulse width modulation performed in the case where the audio signal sent from the audio signal source 101 is an analog signal. In pulse width modulation, an input audio signal 30 is compared against a triangular wave 41 having a frequency of several microseconds (frequency: several hundred kilohertz to several megahertz) and an amplitude Art1. Only when the comparison result shows that the value of the audio signal 30 is larger than the value of the triangular wave 41, a pulse having a positive value is output. The comparison is performed such that when there is no input audio signal or when the value of the audio signal is 0, a pulse having a duty ratio of 50% is output. As a result of this processing, a pulse train having a pulse width in accordance with the magnitude of the audio signal is generated.

Now, an example of processing performed by the pulse width modulation section 102 when the audio signal source 101 outputs a digital audio signal will be described. When the audio signal output from the audio signal source 101 is a PCM (Pulse Code Modulation) signal represented by fs[kHz] and bq bits, the pulse width modulation section 102 performs digital signal processing such as oversampling, noise shaping ($\Delta\Sigma$ modulation) or the like on the PCM signal.

Figure 4:
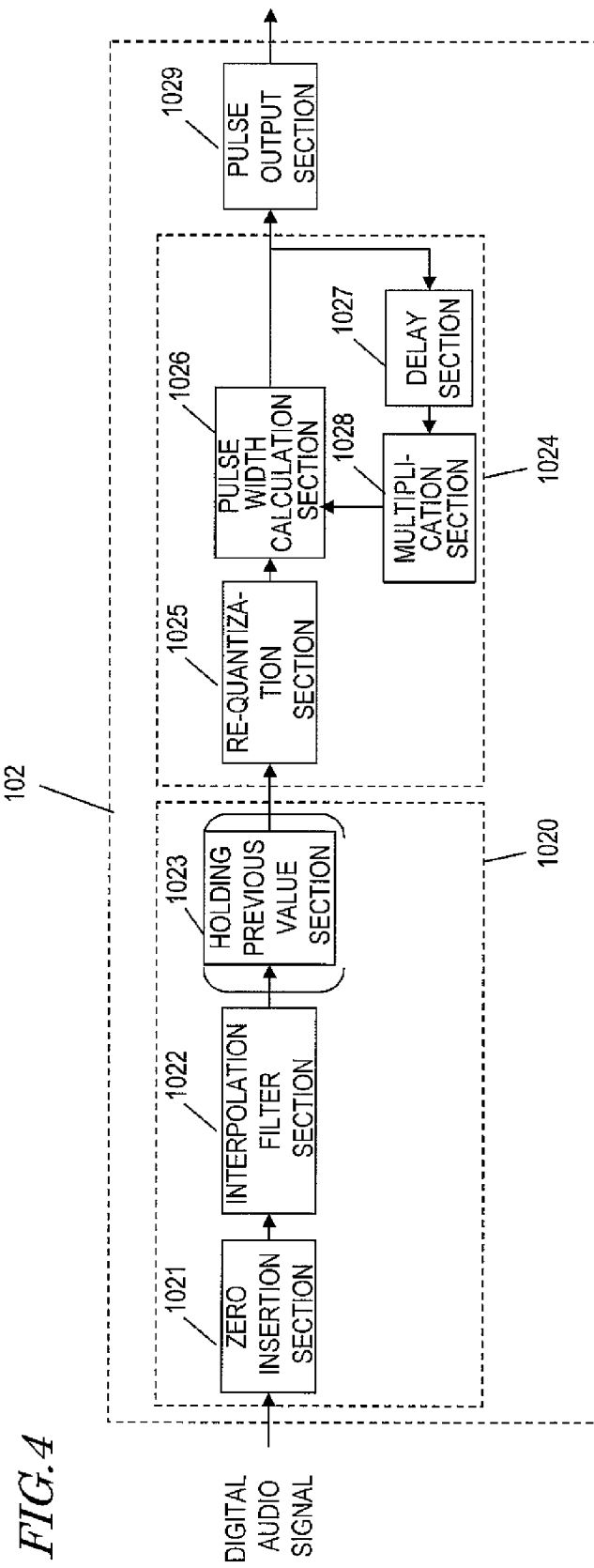
FIG. 4 shows an internal structure of a pulse width modulation section 102.

FIG. 4 is a block diagram showing an example of internal structure of the pulse width modulation section 102 for performing pulse width modulation on a digital audio signal. As shown in FIG. 4, the pulse width modulation section 102 includes an oversampling section 1020, a $\Delta\Sigma$ modulation section 1024, and a pulse output section 1029. The oversampling section 1020 includes a zero insertion section 1021, an interpolation filter section 1022, and a holding previous value section 1023. The holding previous value section 1023 is not absolutely necessary. The $\Delta\Sigma$ modulation section 1024 includes a re-quantization section 1025, a pulse width calculation section 1026, a delay section 1027, and a multiplication section 1028.

As an example, it is now assumed that the digital audio signal is a PCM signal having a sampling frequency fs=48 kHz and a quantization bit rate bq=16 bits and that pulse width modulation is performed after 16-times oversampling and a first order delta-sigma modulation are performed. Since the sampling frequency fs=48 kHz, the sampling cycle of the PCM signal is 1/fs≈20.8 μsec. The PCM signal is first input to the zero insertion section 1021 in the oversampling section 1020.

Figure 5:
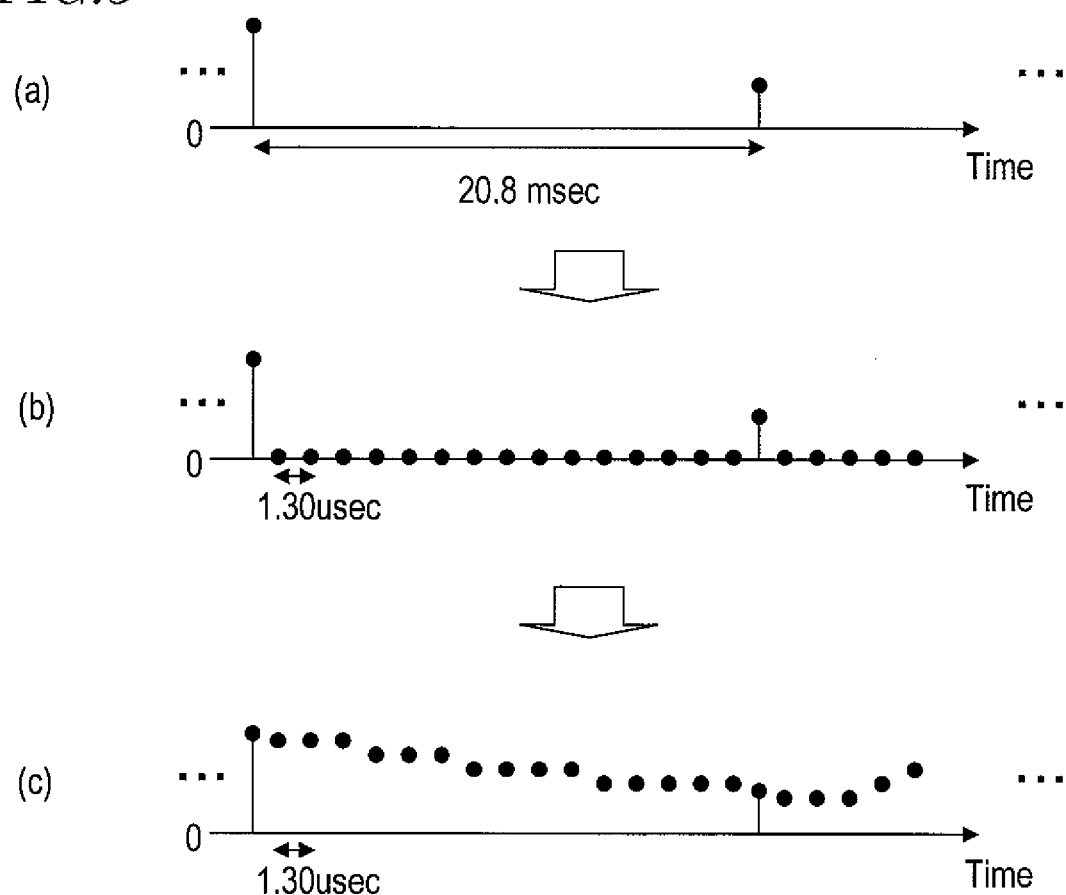
FIG. 5 shows processing of oversampling.

FIG. 5 shows processing performed by the oversampling section 1020. FIG. 5(a) shows an example of PCM signal which is input to the zero insertion section 1021. As shown in FIG. 5(b), when the PCM signal is input to the zero insertion section 1021, the zero insertion section 1021 inserts 15 pieces of PCM data having a value of 0 until the next PCM signal is input (zero insertion processing). The zero insertion section 1021 outputs the post-zero insertion PCM signal to the interpolation filter section 1022. The interpolation filter section 1022 performs interpolation filter (or low pass filter) processing on the post-zero insertion PCM signal. As a result, as shown in FIG. 5(c), non-zero values appear at the sampling points to which zero insertion has been performed, and the sampling points of two 48 kHz PCM signals are interpolated by 768 kHz (=48 kHz×16) sampling points. In the case where the holding previous value section 1023 is provided, the interpolation filter section 1022 sends the post-interpolation PCM signal to the holding previous value section 1023. In the case where the holding previous value section 1023 is not provided, the interpolation filter section 1022 outputs the post-interpolation PCM signal to the re-quantization section 1025 in the $\Delta\Sigma$ modulation section 1024.

The holding previous value section 1023 performs pre-hold processing on the post-interpolation PCM signal. By the pre-hold processing, the sampling frequency can be increased. For example, the oversampling processing can be divided, such that 8-times oversampling is performed by the zero insertion section 1021 and 4-times oversampling is performed by the holding previous value section 1023. This provides an advantage that the setting conditions for the interpolation filter section 1022 are alleviated.

The $\Delta\Sigma$ modulation section 1024 performs noise shaping on the oversampled PCM signal by $\Delta\Sigma$ modulation. Noise shaping is processing of coloring white noise (with no frequency dependence) caused by re-quantization which is generated when the amplitude level number Na ($=2^{bq}-1$) of the PCM signal is larger than the resolution Np of the pulse width and thus concentrating the re-quantization noise outside the audible frequency band. The resolution Np of the pulse width is a numerical value depending on the processing capability of the processor performing the pulse width modulation processing (LSI, DSP, FPGA, etc.).

The re-quantization section 1025 in the ΔΣ modulation section 1024 performs re-quantization on the PCM signal input from the oversampling section 1020. Specifically, the PCM signal quantized at the amplitude level number Na is quantized to have a PCM value of the pulse width resolution Np (Na>Np). The re-quantization section 1025 sends the re-quantized PCM signal to the pulse width calculation section 1026. The pulse width calculation section 1026 performs addition (subtraction) processing on the re-quantized PCM signal sent from the re-quantization section 1025 and on a feedback component output from the multiplication section 1028, and thus determines the width of the pulses to be output. The pulse width calculation section 1026 sends the calculated pulse width to the delay section 1027 and the pulse output section 1029.

The delay section 1027 delays the pulse width output from the pulse width calculation section 1026 by one pulse and sends the value of the delayed pulse to the multiplication section 1028. The multiplication section 1028 multiplies the pulse width delayed by the delay section 1027 by a prescribed coefficient and outputs the resultant pulse width to the pulse width calculation section 1026.

The structure by which the delay section 1027 delays the pulse width output from the pulse width calculation section 1026 by one pulse is an example of structure adoptable in the case where a first order delta-signal modulation used. In the case where, for example, Nth-order delta-signal modulation is used, the pulse width is delayed by one pulse, two pulses, . . . and N pulses, and the value of each of the delayed pulses is output to the multiplication section 1028.

The pulse output section 1029 outputs pulses having a pulse width determined by the pulse width calculation section 1026 to the radio frequency modulation section 106. The amplitude of the pulses output at this point is constant.

The radio frequency modulation section 106 shown in FIG. 1B modulates the PWM pulse sent from the pulse width modulation section 102 into a radio frequency PWM pulse having a frequency which is substantially the same as the resonance frequency f0 (several megahertz to several tens of megahertz) of the resonator 104, and outputs the resultant radio frequency PWM pulse to the class E amplifier 103.

The class E amplifier 103 switches the transistor by the radio frequency PWM pulse, and amplifies the input pulse to have power necessary for power transfer by the switching of the transistor and the DC power (driving power supply Vdd) supplied externally. The class E amplifier 103 sends the amplified pulse train to the resonator 104.

The resonator 104 sends the radio frequency pulse train modulated with the power and the audio signal and amplified to the primary coil 105. As a result, a resonant magnetic field is formed in an external space.

The power receiving device 200 receives an energy of the resonant magnetic field which is input via the secondary coil 201 by means of the resonator 207 having a resonance frequency which is the same as the resonance frequency f0 of the resonator 104, and generates a received signal.

The rectifier 202 performs envelope detection and rectification of the received PWM pulse, which is a radio frequency AC signal having an amplitude which can have a positive value or a negative value, and thus converts the received PWM pulse into a received signal having an amplitude which can only have a positive value. The received signal rectified by the rectifier 202 is sent to the LPF 203.

The LPF 203 is a low pass filter and removes a radio frequency band component from the input received pulse train. By removal of the radio frequency band component from the received pulse train, an audio signal is generated. The LPF 203 sends the audio signal to the speaker 204, and the speaker 204 reproduces the sound.

As described above, the wireless power and data transmission system 1 in this embodiment wirelessly transfers an audio signal and power by use of pulse width modulation. Owing to such a structure, a wireless speaker can be realized.

<1-2. A Main Description (Transfer of Power, Audio Signal and Control Signal)>

Now, a structure and an operation of a wireless speaker for transferring a control signal in addition to the power and the audio signal explained above will be described. In the following description, data transfer from the power transmitting device to the power receiving device will be referred to as "forward link (FL) data transfer", and data transfer from the power receiving device to the power transmitting device will be referred to as "return link (RL) data transfer".

Examples of FL data transferred by the FL data transfer may include an ID of a power transmitting device, an ID and rating of a power receiving device, received power, an inquiry signal for power consumption, a parameter setting signal for the power receiving device, and the like. The information to be transferred is not limited to control information, and may be information such as text data, image data, audio data or the like. For example, in the case where the power receiving device includes a display device such as a liquid crystal display (LCD) or the like, information such as an image or a text to be displayed on the display device may be transferred.

Examples of RL data may include an ID and rating of the power receiving device, received power, a response signal to the inquiry for power consumption, a parameter setting signal for the power transmitting device, an error message and the like. Like the FL data, the information to be transferred is not limited to control information, and may be any type of information.

The FL data transfer is realized by the power transmitting device varying the amplitude of the radio frequency pulse in accordance with the value of the FL data. The amplitude of the pulse may be varied by any of various methods. In this embodiment, the DC voltage Vdd to be applied to the class E amplifier is changed in accordance with the value of the FL data.

By contrast, the RL data transfer is realized by the power receiving device varying the load in accordance with the value of the RL data. When the load is changed, the impedance on the transmitting side is changed. Therefore, the current flowing on the circuit in the power transmitting device and the voltage thereof also change. Hence, the power transmitting device in this embodiment detects the RL data by detecting a change of the current or voltage at an appropriate point on the circuit. As can be seen from this, in this embodiment, the RL data is not directly transmitted from the power receiving device to the power transmitting device, but can be indirectly detected by the power transmitting device through a variation of the load in the power receiving device. For this reason, in this specification, transmission of the RL data from the power receiving device to the power transmitting device by the above-described indirect method is also referred to as "RL data transfer".

During the transfer of the FL data or RL data, the amplitude of the pulse transferred from the power transmitting device 500 to the power receiving device 600 is varied. Therefore, the power transfer and the reproduction of the audio signal are destabilized. Hence, in this embodiment, during the transfer of the FL data or the RL data, the pulse width of the PWM pulse is adjusted to maintain the level of power to be transferred.

Figure 6A:
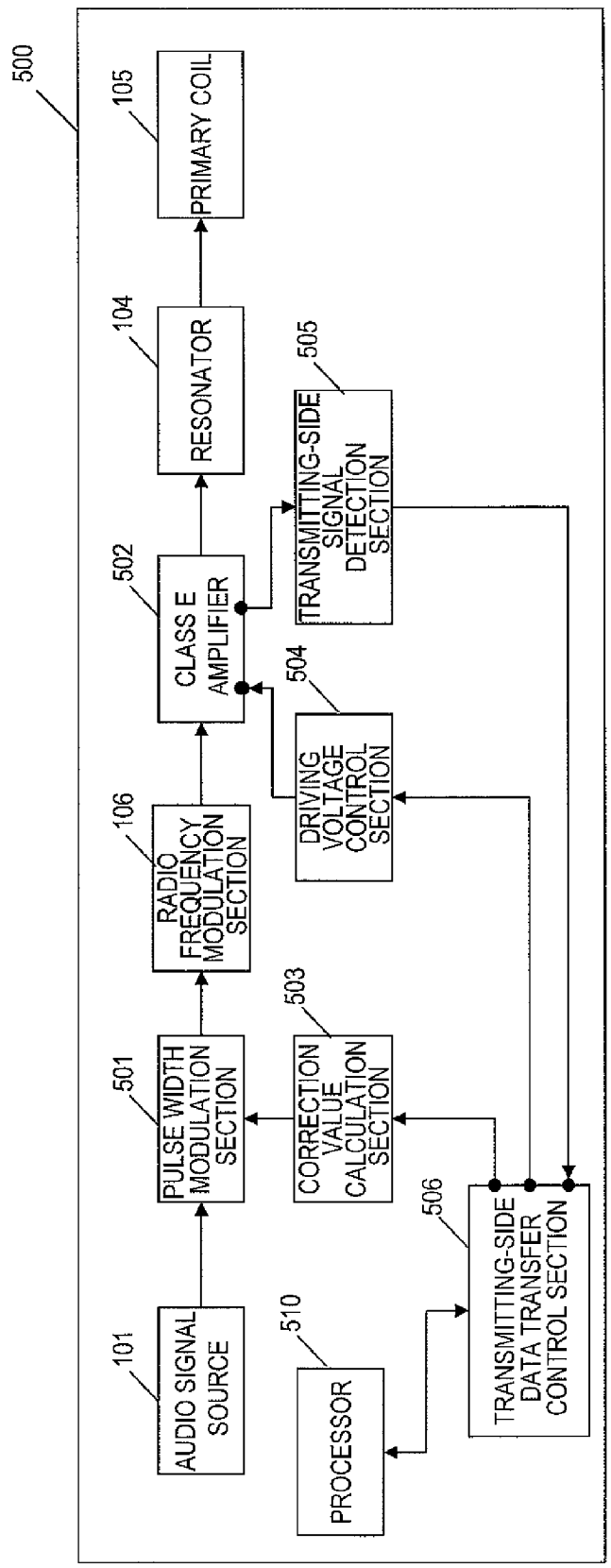
FIG. 6A shows a structure of a power transmitting device 500 of a wireless speaker apparatus in an embodiment of the present invention.
Figure 6B:
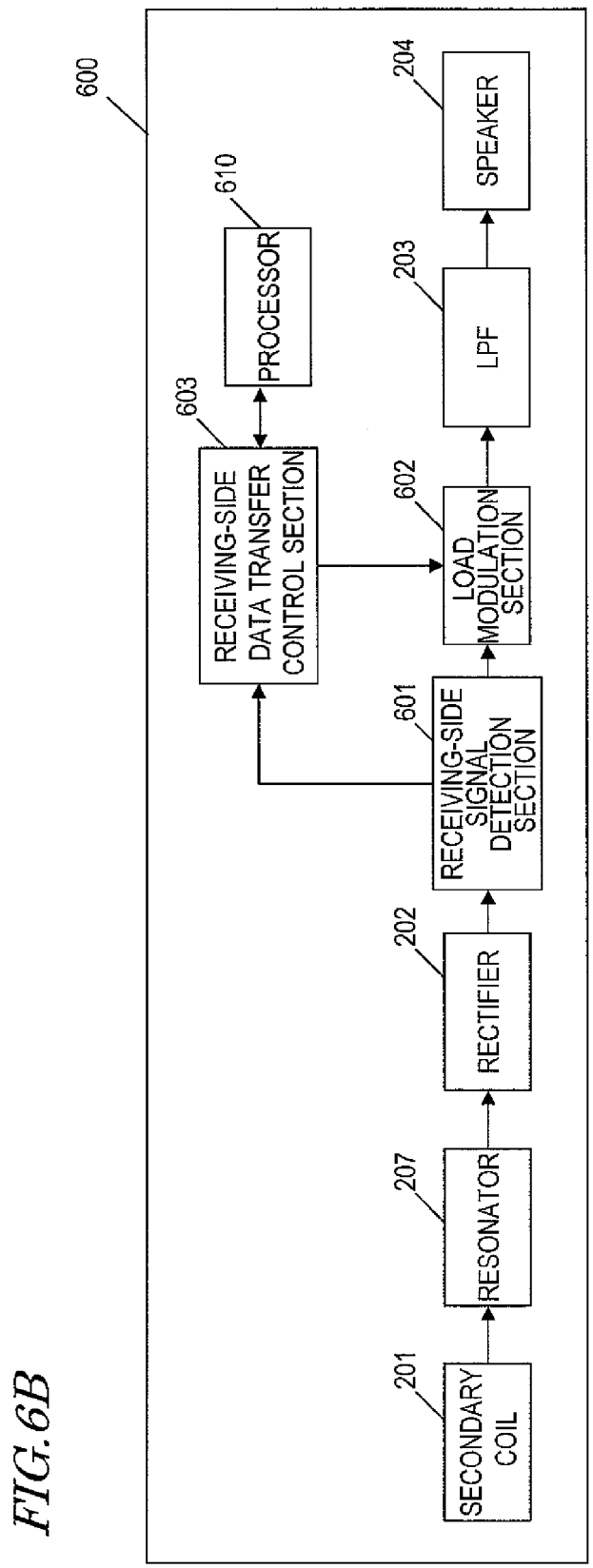
FIG. 6B shows a structure of a power receiving device 600 of the wireless speaker apparatus in an embodiment of the present invention.

FIG. 6A is a block diagram showing an example of structure of the power transmitting device 500 usable for a wireless speaker system (wireless power and data transmission system) capable of transferring FL data and RL data in addition to power and an audio signal. FIG. 6B is a block diagram showing an example of structure of the power receiving device 600 usable for this system.

The power transmitting device 500 includes an audio signal source 101, a resonator 104, a primary coil 105, a radio frequency modulation section 106, a pulse width modulation section 501 and a class E amplifier 502. The pulse width modulation section 501 and the class E amplifier 502 have different functions as those of the pulse width modulation section and the class E amplifier shown in FIG. 1B. The power transmitting device 500 further includes a correction value calculation section 503 for sending a signal representing a correction value for the pulse width to the pulse width modulation section 501, a driving voltage control section 504 for determining a driving voltage Vdd and inputting the driving voltage Vdd to the class E amplifier 502, a transmitting-side signal detection section 505 for detecting a signal flowing in the class E amplifier 502, and a transmitting-side data transfer control section 506 for controlling each of the elements included in the power transmitting device 500.

In this embodiment, the pulse width modulation section 501, the radio frequency modulation section 106, the class E amplifier 502, the resonator 104, and the primary coil 105 cooperate to realize a function of a "power transmitting section" according to the present invention. The transmitting-side data transfer control section 506, the correction value calculation section 503, the driving voltage control section 504, and the transmitting-side signal detection section 505 cooperate to realize a function of a "(transmitting-side) control section" according to the present invention.

The power receiving section 600 includes a secondary coil 201, a resonator 207, a rectifier 202, an LPF 203, a speaker 204, a receiving-side signal detection section 601 for detecting a signal rectified by the rectifier 202, a load modulation section 602 capable of changing the load, and a receiving-side data transfer control section 603 for controlling the load modulation section 602 based on the signal output from the receiving-side signal detection section 601.

In this embodiment, the secondary coil 201, the resonator 207, the rectifier 202, and the receiving-side signal detection section 601 cooperate to realize a function of a "receiving section" according to the present invention. The load modulation section 602 has a function of a "variable load" according to the present invention. The receiving-side data transfer control section 603 has a function of a "(receiving-side) control section" according to the present invention.

Hereinafter, each of the elements included in the power transmitting device 500 and the power receiving device 600 will be described. First, the elements included in the power transmitting device 500 will be described.

The audio signal source 101, the resonator 104, the primary coil 105, and the radio frequency modulation section 106 are the same as those described above and will not be described.

The pulse width modulation section 501 has a function of pulse width correction in addition to the functions of the pulse width modulation section 102 shown in FIG. 1B. Based on a signal representing a correction value which is input from the correction value calculation section 503, the pulse width modulation section 501 can change the width of a PWM pulse obtained based on an audio signal. For example, when the input audio signal is an analog signal, the pulse width modulation section 501 changes the pulse width by changing the amplitude Atr1 or the frequency f0 of the triangular wave 41 shown in FIG. 3. By contrast, when the input audio signal is a digital signal, the pulse width modulation section 501 changes the pulse width by processing described later with reference to FIG. 8.

The class E amplifier 502 has substantially the same structure as that of the class E amplifier 103 shown in FIG. 2, but is usable for a plurality of driving voltages Vdd and outputs a radio frequency PWM pulse having an amplitude obtained by amplifying an amplitude EA, which is in proportion to each of the driving voltages Vdd. To a terminal (b) of the class E amplifier 502, a driving voltage Vdd is applied from the driving voltage control section 504. While no FL data is being transferred, the class E amplifier 502 is supplied with a driving voltage of Vdd=Vdd0, and outputs a radio frequency PWM pulse having an amplitude obtained by amplifying an amplified amplitude EA0. By contrast, while FL data is being transferred, the class E amplifier 502 is supplied with a driving voltage which is different from Vdd0 and is in accordance with the value of the FL data. As a result, the class E amplifier 502 sends a radio frequency PWM pulse having an amplitude modulated in accordance with the FL data to the resonator 104.

The correction value calculation section 503 calculates a correction value to be added to the pulse width such that even when the amplitude of the pulse is changed in accordance with the FL data or the RL data, a pulse area size is kept constant among the pulses. Then, the correction value calculation section 503 transmits the correction value to the pulse width modulation section 501.

The driving voltage control section 504 determines the driving voltage Vdd based on a control signal input from the transmitting-side data transfer control section 506, and inputs the determined driving voltage to the class E amplifier 502. The driving voltage control section 504 can perform variable control on the driving voltage by, for example, using a plurality of DC power supplies (voltage sources) having different output voltages to switch the voltage source to be used in accordance with the control signal. Alternatively, the driving voltage control section 504 may perform substantially the same control by varying the output of a single voltage source by use of a variable resistor or the like.

While no FL data is being transferred, the driving voltage control section 504 outputs the driving voltage Vdd0 to the class E amplifier 502. By contrast, while FL data is being transferred, the driving voltage control section 504 selects one of the plurality of driving voltages in accordance with the content of the FL data represented by the control signal, and outputs the selected driving voltage to the class E amplifier 502. For example, for transferring FL data by binary amplitude modulation, the driving voltage is switched between two values of driving voltages Vdd1 and Vdd2 in accordance with the content of the FL data. For transferring FL data by N-value amplitude modulation (N is an integer of 3 or greater), the driving voltage is switched among N driving voltages (Vdd1, Vdd2, VddN) in accordance with the content of the FL data.

The transmitting-side signal detection section 505 is a detector for observing a change of the current and the voltage in the class E amplifier 502, which occurs when the load is changed in the power receiving device 600. The transmitting-side signal detection section 505 detects a change of the load in the power receiving device 600 by observing at least one of the current and the voltage in the class E amplifier 502, and transmits the detection result (load change detection signal) to the transmitting-side data transfer control section 506.

The transmitting-side data transfer control section 506 is a circuit for controlling the data transfer. The transmitting-side data transfer control section 506 is connected to a processor 510 such as a CPU, a microprocessor, a DSP, an FPGA or the like, and receives a value of data to be transmitted. The processor 510 may be provided outside the power transmitting device 500. The transmitting-side data transfer control section 506 generates a control signal based on the FL data to be transferred to the power receiving device 600, and sends the control signal to the correction value calculation section 503 and the driving voltage control section 504. The transmitting-side data transfer control section 506 receives the load change detection signal from the transmitting-side signal detection section 505, and detects RL data sent from the power receiving device 600 based on the detection signal. Based on the RL data, the transmitting-side data transfer control section 506 also controls time division between the FL data transfer and the RL data transfer as described later.

Now, each of the elements included in the power receiving device 600 shown in FIG. 6B will be described.

The secondary coil 201, the rectifier 202, the LPF 203, the speaker 204, and the resonator 207 are the same as those shown in FIG. 1B and will not be described.

The receiving-side signal detection section 601 is a circuit for observing the amplitude of the output signal (received pulse) from the rectifier 202 and detecting the FL data having the modulated amplitude. The receiving-side signal detection section 601 sends a signal representing the detected FL data (amplitude detection signal) to the receiving-side data transfer control section 603. The receiving-side signal detection section 601 also sends the received pulse sent from the rectifier 202 to the load modulation section 602.

The receiving-side data transfer control section 603 is a circuit for controlling the data transfer. The receiving-side data transfer control section 603 is connected to a processor 610 such as a CPU, a microprocessor, a DSP, an FPGA or the like, and receives the content of the RL data to be transmitted to the power transmitting device 500. The processor 610 may be provided outside the power receiving device 600. The receiving-side data transfer control section 603 sends a control signal based on the received RL data to the load modulation section 602. The receiving-side data transfer control section 603 also receives the amplitude detection signal from the receiving-side signal detection section 601, and detects the FL data sent from the power transmitting device 500 based on the signal. Based on the FL data, the receiving-side data transfer control section 603 also controls time division between the FL data transfer and the RL data transfer as described later.

The load modulation section 602 changes the load in accordance with the content of the RL data represented by the signal sent from the receiving-side data transfer control section 603. The load modulation section 602 may have, for example, a structure shown in FIG. 2 of Japanese Laid-Open Patent Publication No. 2008-206305 as a structure for changing the load. The entirety of Japanese Laid-Open Patent Publication No. 2008-206305 is incorporated herein by reference. There is no specific limitation on the method of modulating the load, and any known method is usable as long as the amplitude of the pulse is changed as a result of the load modulation. The load modulation section 602 sends the pulse sent from the receiving-side signal detection section 601 to the LPF 203. When the load is changed by the load modulation section 602, the amplitude of the pulse transferred from the power transmitting device 500 to the power receiving device 600 is changed.

Now, an operation of the power transmitting device 500 and the power receiving device 600 for transferring the FL data and the RL data will be described.

The wireless speaker device 2 in this embodiment performs bidirectional data transfer between the power transmitting device 500 and the power receiving device 600 in addition to transmitting the power for driving the speaker 204 of the power receiving device 600 and the audio signal to be reproduced by the speaker 204 from the power transmitting device 500 to the power receiving device 600. In the following description, it is assumed that the power for driving the speaker 204 in the power receiving device 600 and the audio signal to be reproduced by the speaker 204 are being transferred from the power transmitting device 500 to the power receiving device 600, namely, that the pulses are being transmitted from the power transmitting device 500. It is also assumed that in this state, the FL data transfer and the RL data transfer are performed in a time division manner.

Figure 7:
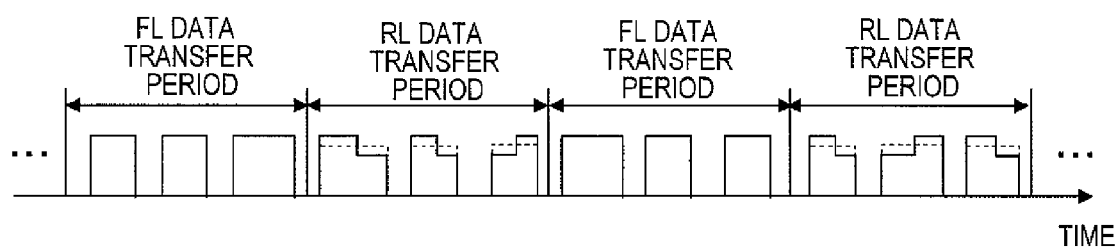
FIG. 7 shows an example of time division of FL data transfer and RL data transfer.

FIG. 7 shows an example in which the FL data transfer and the RL data transfer are performed in a time division manner. As shown in FIG. 7, an FL data transfer period and an RL data transfer period are set alternately in repetition. In this example, the FL data transfer period and the RL data transfer period have an equal length to each other, and three pulses are sent for the FL data transfer period and also in the RL data transfer period. During the FL data transfer period, pulses of a usual shape are transferred from the power transmitting device 500 to the power receiving device 600. By contrast, during the RL data transfer period, pulses having a value changed during the duration thereof are transferred from the power receiving device 600 to the power transmitting device 500. The RL data is represented by such a change of the pulse shape.

In FIG. 7, in each of the FL data transfer period and the RL data transfer period, three pulses are sent. The present invention is not limited to such an example. Each of the periods may be set to be different in accordance with the amount and the occurrence frequency of the FL data and the amount and the occurrence frequency of the RL data. The ratio between the FL data transfer period and the RL data transfer period may be determined when the devices are designed, when the audio signal starts to be transferred, or when the data starts to be transferred, or may be adaptively determined during the data transfer. The FL data transfer period and the RL data transfer period do not need to appear alternately. There may be a period in which neither the FL data nor the RL data is transferred (data non-transfer period) in the middle.

The control on the time division of the FL data transfer and the RL data transfer is performed by the transmitting-side data transfer control section 506 in the power transmitting device 500 and the receiving-side data transfer control section 603 in the power receiving device 600.

First, an operation of the power transmitting device 500 and the power receiving device 600 during the FL data transfer period will be described. In the following, the FL data is transferred with binary (0/1) amplitude modulation. The operation is easily applicable to a case where the FL data is transferred with N-value amplitude modulation (N is an integer of 3 or greater), and thus such a case will not be described.

First, the audio signal source 101 sends an audio signal to be reproduced by the speaker 204 in the power receiving device 600 to the pulse width modulation section 501.

The transmitting-side data transfer control section 506 receives, from the processor 510, the content of the data to be transmitted. During the FL data transfer period, the transmitting-side data transfer control section 506 generates FL data by converting the data, received from the processor 510, into a form which can be transferred by wireless power and data transmission. The FL data is a binary data stream formed of a plurality of 0 or 1 bits.

The transmitting-side data transfer control section 506 changes the signal to be sent to the correction value calculation section 503 and the driving voltage control section 504 in accordance with the value of the FL data (0/1). Specifically, when the FL data is 0, the transmitting-side data transfer control section 506 transmits a signal representing "correction value P1" to the correction value calculation section 503 and transmits a signal representing "driving voltage Vdd1" to the driving voltage control section 504. By contrast, when the FL data is 1, the transmitting-side data transfer control section 506 transmits a signal representing "correction value P2" to the correction value calculation section 503 and transmits a signal representing "driving voltage Vdd2" to the driving voltage control section 504.

Now, a pulse modulation operation will be described more specifically for a case where the FL data is 0 and for a case where the FL data is 1.

(1) When the FL Data is 0

The transmitting-side data transfer control section 506 sends a control signal representing "correction value P1" to the correction value calculation section 503, and sends a control signal representing "driving voltage Vdd1" to the driving voltage control section 504.

Based on the control signal sent from the transmitting-side data transfer control section 506, the correction value calculation section 503 sends a signal representing correction value P1 to the pulse width modulation section 501.

The pulse width modulation section 501 generates a PWM pulse by use of the audio signal sent from the audio signal source 101 and the signal representing correction value P1 sent from the correction value calculation section 503. Hereinafter, an example of processing performed when the audio signal is a digital audio signal (PCM signal) will be described.

Figure 8:
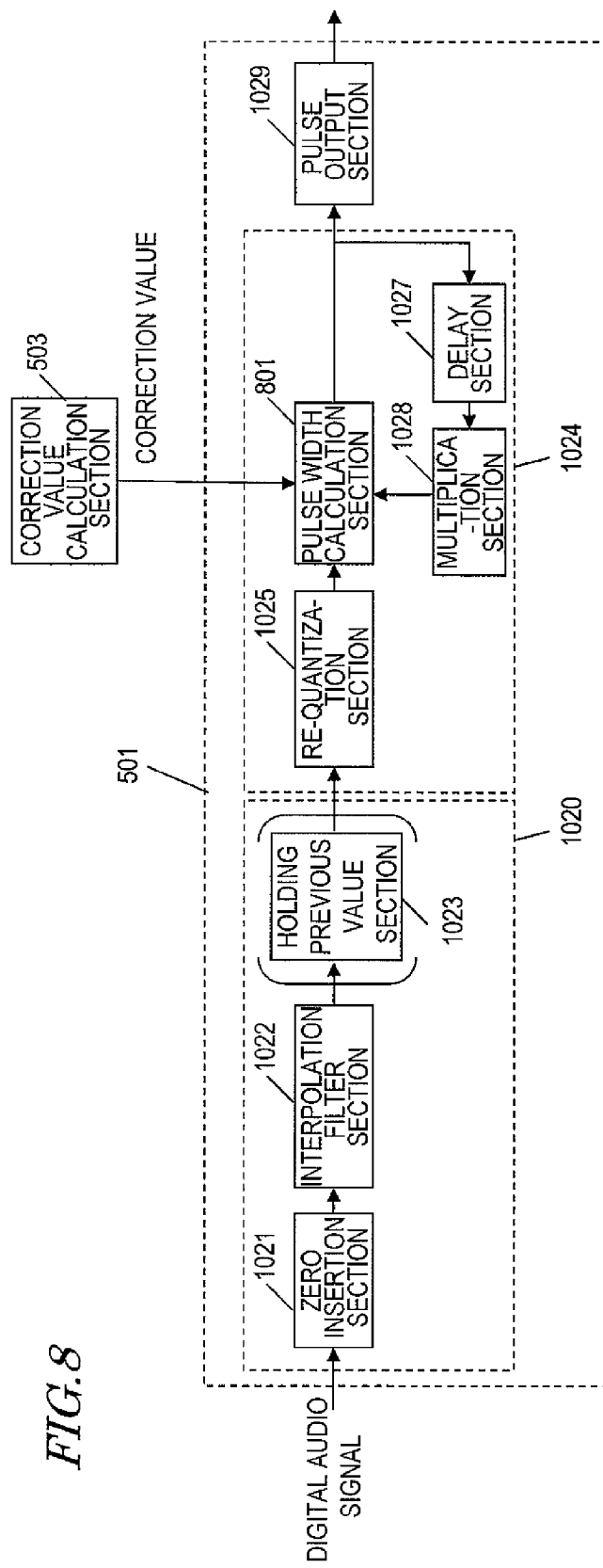
FIG. 8 shows a structure of a pulse width modulation section 501.

FIG. 8 is a block diagram showing an example of structure of the pulse width modulation section 501 in this case. In the pulse width modulation section 501, the pulse width calculation section 1026 in the pulse width modulation section 102 shown in FIG. 4 is replaced with a pulse width calculation section 801. The pulse width calculation section 801 calculates a pulse width by performing addition or subtraction on the PCM value sent from the re-quantization section 1025, a feedback value sent from the multiplication section 1028, and correction value P1 sent from the correction value calculation section 503, and sends the resultant pulse width to the pulse output section 1029 and the delay section 1027. The pulse width modulation section 501 sends the PWM pulse to the radio frequency modulation section 106.

By contrast, when the audio signal is an analog audio signal, the pulse width modulation section 501 changes the width of the PWM pulse by changing the amplitude or the frequency of the triangular wave 41 shown in FIG. 3 based on the signal representing correction value P1 sent from the correction value calculation section 503. In the case where a reference wave such as a sawtooth wave or the like is used instead of the triangular wave 41, the amplitude or the frequency is changed to provide substantially the same result. The pulse width modulation section 501 executes the above-described processing by recording, in advance, information defining the correspondence between the correction value and the amplitude or the frequency of the reference wave on, for example, a memory (not shown) and referring to the information.

The radio frequency modulation section 106 modulates the PWM pulse sent from the pulse width modulation section 501 into a radio frequency PWM pulse having a frequency which is substantially the same as the resonance frequency f0 (several megahertz to several tens of megahertz) of the resonator 104, and outputs the radio frequency PWM pulse to the class E amplifier 503.

The driving voltage control section 504 has received the control signal representing "driving voltage Vdd1" from the transmitting-side data transfer control section 506. Therefore, the driving voltage control section 504 supplies a driving voltage of Vdd1 to the class E amplifier 502.

Next, the class E amplifier 502 switches the transistor by use of the radio frequency PWM pulse sent from the radio frequency modulation section 106, and outputs the amplified radio frequency PWM pulse. At this point, the post-amplification radio frequency PWM pulse has an amplitude of EA1, which is in proportion to Vdd1.

The class E amplifier 502 sends the post-amplification radio frequency PWM pulse to the resonator 104. The post-amplification radio frequency PWM pulse is transferred from the primary coil 105 to the power receiving device 600 as a resonant magnetic field.

(2) When the FL Data is 1

The transmitting-side data transfer control section 506 sends a control signal representing "correction value P2" to the correction value calculation section 503, and sends a control signal representing "driving voltage Vdd2" to the driving voltage control section 504.

Based on the control signal sent from the transmitting-side data transfer control section 506, the correction value calculation section 503 sends a signal representing correction value P2 to the pulse width modulation section 501.

The pulse width modulation section 501 generates a PWM pulse by use of the audio signal sent from the audio signal source 101 and the signal representing correction value P2 sent from the correction value calculation section 503, and sends the PWM pulse to the radio frequency modulation section 106.

The processing performed by the pulse width modulation section 501 is the same as when the FL data is 0 except that the correction value is P2 instead P1, and thus will not be described.

The radio frequency modulation section 106 modulates the PWM pulse sent from the pulse width modulation section 501 into a radio frequency PWM pulse having a frequency which is substantially the same as the resonance frequency f0 (several megahertz to several tens of megahertz) of the resonator 104, and outputs the radio frequency PWM pulse to the class E amplifier 502.

The driving voltage control section 504 has received the control signal representing "driving voltage Vdd2" from the transmitting-side data transfer control section 506. Therefore, the driving voltage control section 504 supplies a driving voltage of Vdd2 the class E amplifier 502.

Next, the class E amplifier 502 switches the transistor by use of the radio frequency PWM pulse sent from the radio frequency modulation section 106, and outputs the amplified radio frequency PWM pulse. At this point, the post-amplification radio frequency PWM pulse has an amplitude of EA2, which is in proportion to Vdd2.

The class E amplifier 502 sends the post-amplification radio frequency PWM pulse to the resonator 104. The post-amplification radio frequency PWM pulse is transferred from the primary coil 105 to the power receiving device 600 as a resonant magnetic field.

In the above, Vdd0, Vdd1 and Vdd2 are described as different values. Alternatively, Vdd0, Vdd1 and Vdd2 may be set as Vdd0=Vdd1 or Vdd0=Vdd2, so that the driving voltage for transferring the value of 0 or 1 is equal to the driving voltage Vdd0 during the data non-transfer period. By such a setting, correction value P1 or P2 may be made 0. As a result, either in the period in which the FL data is 0 or in period in which the FL data is the 1, the operation of the pulse width modulation section 501 and the class E amplifier 502 may be the same as the operation while no FL data is being transferred. This simplifies the structure, and the embodiment is made more desirable. Hence, the following description will be made with the settings of Vdd0=Vdd1>Vdd2. At this point, 0=P0=P1<P2 and EA0=EA1>EA2.

In this embodiment, during the FL data transfer, the receiving-side data transfer control section 603 in the power receiving device 600 does not control the load of the load modulation section 602. The receiving-side data transfer control section 603 sends a signal, instructing to detect the received FL data based on the amplitude of the received PWM pulse, to the receiving-side signal detection section 601.

During the FL transfer, the power receiving device 600 receives a resonant magnetic field and converts the received resonant magnetic field into a received PWM pulse via the secondary coil 201, the resonator 207 and the rectifier 202.

The receiving-side signal detection section 601 detects the amplitude of the received PWM pulse. The receiving-side signal detection section 601 compares the amplitude DA of the received PWM pulse against a preset threshold value TA. When it is determined that the amplitude DA of the PWM pulse is larger than TA, the receiving-side signal detection section 601 sends, to the receiving-side data transfer control section 603, the information that FL data 0 has been transferred. When it is determined that the amplitude DA of the PWM pulse is smaller than TA, the receiving-side signal detection section 601 sends, to the receiving-side data transfer control section 603, the information that FL data 1 has been transferred. The above-described signal detection method is one example, and any other method for detecting a pulse-amplitude-modulated signal may be used.

The receiving-side data transfer control section 603 decodes the FL data sent from the receiving-side signal detection section 601 and sends the resultant FL data to the processor 610. The receiving-side signal detection section 601 sends the received PWM pulse after the amplitude is detected to the load modulation section 602. During the FL data transfer, the load modulation section 602 does not operate and acts as a fixed load. Then, the PWM signal is converted into an audio signal by the LPF 203 and reproduced by the speaker 204.

FIG. 9 shows that the level of the audio signal output from the LPF 203 does not change regardless of whether the value of the FL data is 0 or 1. The LPF 203, which is a low pass filter, is formed of an integrator. Therefore, as shown in FIG. 9(*a*) and FIG. 9(*b*), even if the amplitude of the pulses input to the LPF 203 is changed, the pulse area size (duration×value) can be kept constant by increasing the pulse width by an amount corresponding to the change. Thus, the output of the integrator is the same.

So far, the operation of the power transmitting device 500 and the power receiving device 600 during the FL data transfer has been described. As described above, in this embodiment, the FL data transfer period and the RL data transfer period are set alternately in a time division manner. The pulse amplitude is modulated in accordance with the value of the FL data to be transferred, and the pulse width is changed such that the pulse area size is kept constant. In this manner, stable transfer of the power and the audio signal is realized.

In the above-described example, the pulse width is modulated such that the pulse area size is kept constant. However, it is not absolutely necessary that the pulse area size should be kept precisely constant. As long as the pulse width is controlled to be changed such that the change of the power level is decreased, a certain degree of effect can be provided.

Now, an operation of the power transmitting device 500 and the power receiving device 600 during the RL data transfer period will be described.

Even during the RL data transfer, an audio signal having a sufficient level of power for driving the speaker 204 is being transferred from the power transmitting device 500 to the power receiving device 600. Processing on the audio signal transfer is as described above. Therefore, hereinafter, only processing regarding the RL data transfer will be described.

First, during the RL data transfer, the receiving-side data transfer control section 603 in the power receiving device 600 receives the content of the data, to be transmitted to the power transmitting device 500, from the processor 610. During the RL data transfer period, the receiving side data transfer control section 603 generates RL data by converting data, received from the processor 610 into a form which can be transferred by wireless power and data transmission. In this embodiment, the RL data is a binary data stream formed of a plurality of 0 or 1 bits. The receiving-side data transfer control section 603 transfers the RL data to the load modulation section 602. The RL data does not need to be a binary data stream, and may be an N-value data stream (N is an integer of 3 or greater). For transmitting an N-value data stream, the load value may be changed in N steps.

The load modulation section 602 switches the load in accordance with the content of the RL data. The power receiving device 600 transfers the RL data by use of the change of the PWM pulse amplitude, which is caused as a result of the switching of the load.

FIG. 10 shows how the pulse amplitude is changed by the load modulation. As shown in FIG. 10, the load modulation section 602 changes the load at a central time point of the duration of each PWM pulse (the duration of the pulse is the time period defined by the pulse width). When the RL data is 0, the load modulation section 602 changes the load such that the pulse width of the PWM pulse is changed from high to low at the central time point of the PWM pulse. By contrast, when the RL data is 1, the load modulation section 602 changes the load such that the pulse width of the PWM pulse is changed from low to high at the central time point of the PWM pulse. In FIG. 10, the amplitude level represented by the dotted line is the average amplitude level of the PWM pulses after the load modulation. The average amplitude level is lower than the amplitude level EA0 obtained while neither the FL data nor the RL data is being transferred.

The pulse waveform shown in FIG. 10 is the pulse waveform at the observation point of the transmitting-side signal detection section 505. It takes some time for the influence of the change of the load to be transmitted to the transmitting-side signal detection section 505. Therefore, the load modulation section 602 needs to change the load earlier by that time than the central time point of the pulse detected by the receiving-side signal detection section 601. This time shift is measured in advance when the system is designed and corrected.

In this embodiment, the load modulation section 602 changes the amplitude once in one PWM pulse. However, the load change is not limited to being performed once, and may be performed twice or more as long as the pulse shape after the amplitude change is different between when the RL data is 0 and when the RL data is 1. In this embodiment, the load is controlled such that the amplitude is changed at the central time point of the duration of each pulse. However, it is not absolutely necessary that the load is controlled such that the amplitude is changed at the central time point.

The load modulation section 602 is structured to modulate one PWM pulse with one piece of RL data, but the present invention is not limited to this. A plurality of PWM pulses may be modulated with one piece of RL data. Such a structure lowers the transfer rate of the RL data, but can improve the durability against noise, distortion, synchronization shift or the like.

Now, an operation of the power transmitting device 500 during the RL data transfer will be described.

During the RL data transfer, the transmitting-side data transfer control section 506 sends correction value PR to the correction value calculation section 503. This is performed for the following reason. As described above, the average value of the PWM pulse amplitudes becomes smaller than the PWM pulse amplitude during the data non-transfer period due to the load modulation performed by the load modulation section 602 in the power receiving device 600. The transmission of correction value PR is performed in order to correct this with the pulse width. An operation of the pulse width modulation section 501 when correction value PR is input is different from the operation thereof during the FL data transfer merely in the correction value, and thus will not be described. During the RL data transfer, the transmitting-side data transfer control section 506 does not transmit a signal representing a driving voltage to the driving voltage control section 504, or transmits a signal representing "driving voltage Vdd0" to the driving voltage control section 504. In this embodiment, the transmitting-side data transfer control section 506 and the correction value calculation section 503 cooperate to realize a function of a "pulse width correction section".

When the transmitting-side signal detection section 505 detects the data from the power receiving device 600, the transmitting-side data transfer control section 506 corrects the pulse width such that pulse area size is kept constant, based on a value obtained from the pulse amplitude of the pulse train when the transmitting-side signal detection section 505 detects the data from the power receiving side and the pulse amplitude when the transmitting-side signal detection section 505 does not detect the data. It is preferable that the pulse area size is kept constant. However, even if the pulse area size is not kept constant, as long as the pulse width is adjusted such that the change of the power level is decreased, a certain degree of effect can be provided.

Hereinafter, a method by which the power transmitting device 500 detects the RL data will be described.

The class E amplifier 502 includes three input/output terminals (a), (b) and (c) like the class E amplifier 103 shown in FIG. 2. The terminal (a) is a terminal to which a radio frequency PWM signal is input, and is connected to a transistor Tr. The terminal (b) is a terminal to which the driving voltage Vdd is input. The voltage to be input to the terminal (b) is switched among the voltages Vdd0, Vdd1 and Vdd2 in accordance with an instruction from the transmitting-side data transfer control section 506. The terminal (c) is a terminal from which the post-amplification radio frequency PWM pulse is output. As described above, when the load in the power receiving device 600 is changed, the influence of the load change can be detected in the class E amplifier 502. Specifically, when the load in the power receiving device 600 is changed, currents Io, is, ig, iR and ic and the voltage vs shown in FIG. 2 are changed. Therefore, by observation of any of these, the RL data represented by the load change in the power receiving device 600 can be detected. Based on the change of the current or the voltage in the class E amplifier 502, the transmitting-side signal detection section 505 detects whether the transferred RL data is 0 or 1, and sends the detection result to the transmitting-side data transfer control section 506.

The transmitting-side data transfer control section 506 decodes the RL data sent from the transmitting-side signal detection section 505, and sends the resultant RL data to the processor 510.

Figures 11, 12:
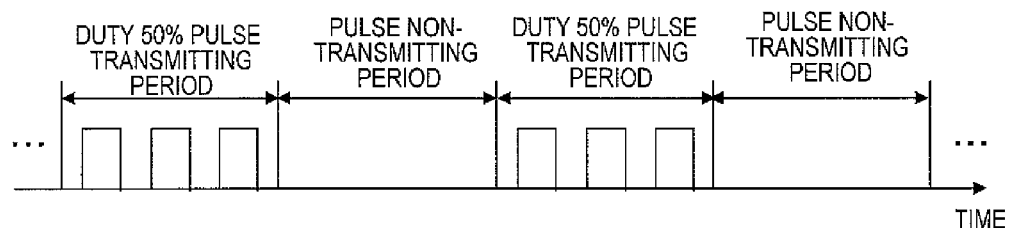
FIG. 11 is a table showing examples of pulse width correction value, driving voltage and post-amplification PWM pulse amplitude that are set in accordance with presence/absence of FL data and RL data and values of the FL data and the RL data.
FIG. 12 shows pulses transmitted by the power transmitting device 500 for obtaining TDD synchronization.

FIG. 11 is a table showing how the pulse width correction value, the driving voltage, the amplitude of the post-amplification PWM pulse are set by the power transmitting device 500 in this embodiment in accordance with presence/absence of FL data and RL data and the values of the FL data and the RL data. As shown in FIG. 11, in the period in which neither FL data nor RL data is being transferred, the pulse width and the driving voltage are set to default values thereof. During the FL data transfer, the driving voltage and the pulse width correction value are set in accordance with the value of the FL data. As a result, the post-amplification PWM pulse amplitude is changed in accordance with the value of the FL data. By contrast, during the RL data transfer, the pulse width correction value is set to a constant value PR regardless of the value of the RL data.

A reason why the pulse width correction value set to a constant value regardless of the value of the RL data is that the load in the power receiving device 600 is controlled such that the pulse area size is kept constant. If the power receiving device 600 is structured such that the pulses have different area sizes in accordance with the value of the RL data, it is preferable that the power transmitting device 500 changes the pulse width correction value in accordance with the value of the RL data. According to another structure, the load may be modulated such that the pulses have the same area size as the area size in the case where it is assumed that the RL data is not being transferred. Such a structure accompanies a slight transfer loss and thus is inefficient, but has an advantage that the power transmitting device 500 does not need to adjust the pulse width.

The change of the load in the power receiving device is not limited to be a change of a Manchester code as described above, and may be a change of a sine wave or a triangular wave. For example, when a sine wave is used, it is slightly difficult to control the load, but there is an advantage that the noise is decreased. In the above description, the RL data transfer is performed while the audio signal is being transferred. Alternatively, the RL data transfer may be performed only in a period in which the sound volume is 0, for example, while the audio signal is stopped or is being reproduced.

As described above, the power transmitting device 500 and the power receiving device 600 in this embodiment can transfer a sufficient level of power to drive the speaker 204 by a single magnetic carrier wave together with an audio signal and bidirectional data (RL data and FL data). In this embodiment, as described above, the FL data and the RL data, which are bidirectional data, are transferred in a time division manner.

<1-3. TDD Timing Synchronization Method>

Now, an example of method for obtaining synchronization of the FL data transfer period and the RL data transfer period (or non data-transfer period) (hereinafter, such synchronization will be referred to as "TDD synchronization") between the power transmitting device 500 and the power receiving device 600 will be described.

FIG. 12 shows the pulse transmitted by the power transmitting device 500 for obtaining TDD synchronization. In a period in which the power transmitting device 500 is not transmitting an audio signal, the power transmitting device 500 transmits a pulse for obtaining TDD synchronization as shown in FIG. 12. The "period in which the power transmitting device 500 is not transmitting an audio signal" is, for example, before and after the audio signal is reproduced, between the tunes, or when the power transmitting device 500 is turned on. The period in which the power transmitting device 500 is not transmitting an audio signal corresponds to a period in which the audio signal source 101 is outputting a signal having a PCM value of 0. A PWM pulse corresponding to a PCM value of 0 is a pulse having a duty ratio of 50%, and the pulse having a duty ratio of 50% is output from the speaker 204 in the power receiving device 600 as silence.

As shown in FIG. 12, during the TDD synchronization, the power transmitting device 500 is in a period in which pulses having a duty ratio of 50% are transmitted and in a period in which no pulse is transmitted alternately in repetition. In the following, the period in which pulses having a duty ratio of 50% are transmitted will be referred to as a "duty 50% pulse transmission period", and the period in which no pulse is transmitted will be referred to as a "pulse non-transmission period". The duty 50% pulse transmission period of the power transmitting device 500 has the same length as that of the FL data transfer period, and the pulse non-transmission period of the power transmitting device 500 has the same length as that of the RL data transfer period. Owing to such a setting, the power receiving device 600 which has received the pulses as shown in FIG. 12 can detect the period in which the pulses are transmitted and the period in which no pulse is transmitted. Accordingly, the FL data transfer period and the RL data transfer period can be detected, and as a result, the TDD synchronization can be obtained.

As described above, during the duty 50% pulse transmission period, an audio signal having a PCM value of 0 is output. Therefore, no sound is output from the speaker 204 in the power receiving device 600. During the pulse non-transmission period, a pulse having a duty ratio of 0% represents a PCM value having a maximum amplitude in a negative direction. When such pulses are sent continuously, such pulses are cut by a DC component cut filter (not shown) included in the power receiving device 600 and thus are not input to the speaker 204. Therefore, no sound is output. Here, transmission of no pulse and transmission of a pulse having a duty ratio of 0% have the same meaning. Hence, the pulse non-transmission period may be considered as a "duty 0% pulse transmission period".

In the above description, the duty 50% pulse transmission period corresponds to the FL data transfer period, and the pulse non-transmission period corresponds to the RL data transfer period. The present invention is not limited to this, and even when the correspondence is opposite, substantially the same effect is provided.

The power receiving device 600 can calculate the pulse central time point, which is required for the load modulation, by receiving the pulses shown in FIG. 12. Specifically, during the duty 50% pulse transmission period, the transmitted pulses all have the same pulse width. Therefore, the rise time and the fall time of each pulse are detected, and based on these, the central time point can be found. The central time points of the previous and subsequent pulses are found in substantially the same manner, and thus a—clock signal synchronized to the pulse central time point is obtained.

When the central time point of each pulse is calculated, it is not absolutely necessary to provide the duty 50% pulse transmission period and the pulse non-transmission period as shown in FIG. 12. For example, pulses having an equal duty ratio may be continuously sent for a certain period. By such a setting also, a clock signal synchronized to the pulse central time point is obtained.

Embodiment 2

Now, Embodiment 2 of the present invention will be described. In Embodiment 1, an FL data transfer method by which the driving voltage of the class E amplifier is changed to change the amplitude of the PWM pulse is described. In this embodiment, as another example of FL data transfer method, an FL data transfer method by which the switching frequency of the class E amplifier is changed to change the amplitude of the PWM pulse will be described. In the following, points substantially the same as those of Embodiment 1 will not be described, and points different from Embodiment 1 will be mainly described.

Figure 13:
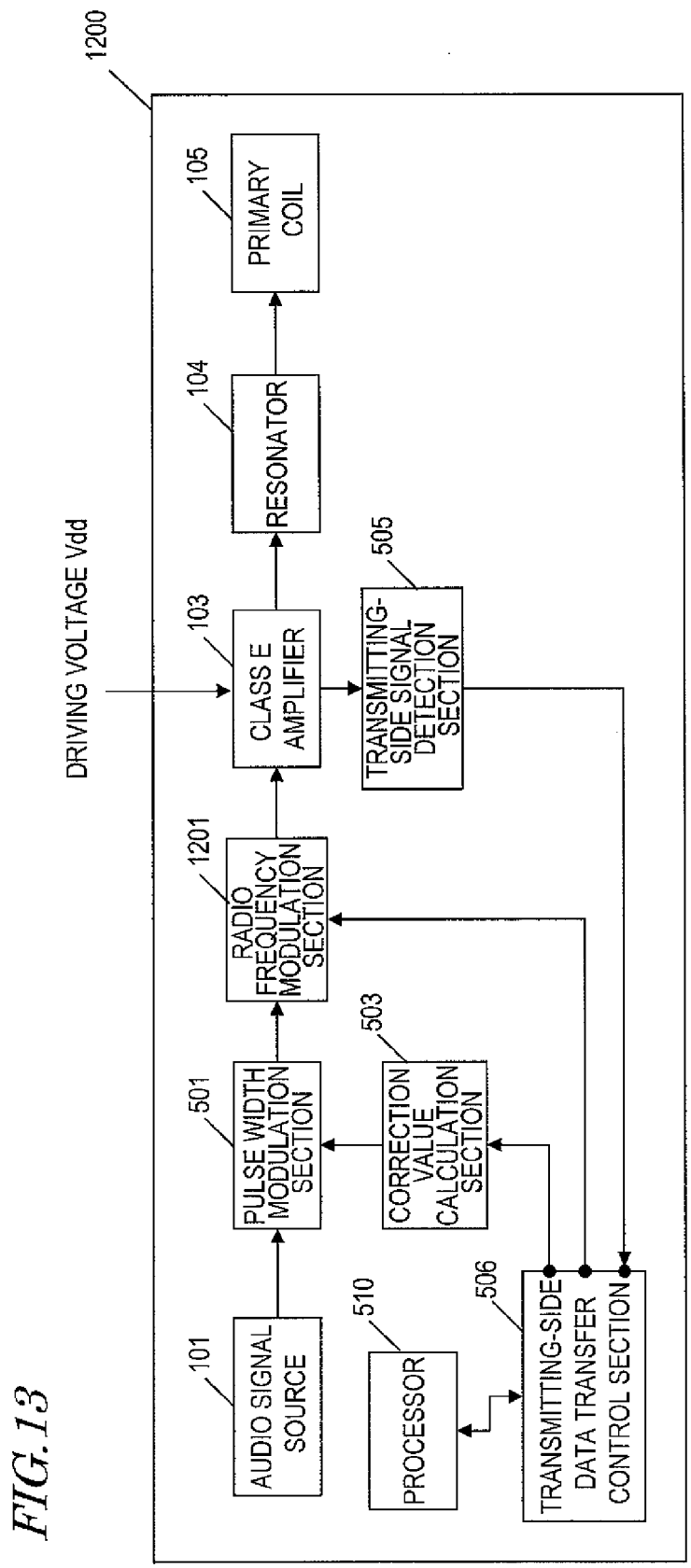
FIG. 13 shows a structure of a power transmitting device 1200 in Embodiment 2.

FIG. 13 is a block diagram showing a structure of a power transmitting device 1200 in this embodiment. The power transmitting device 1200 in this embodiment includes an audio signal source 101, a pulse width modulation section 501, a radio frequency modulation section 1201, an class E amplifier 103, a resonator 104, a primary coil 105, a transmitting-side data transfer control section 506, a correction value calculation section 503, and a transmitting-side signal detection section 505. The elements other than the radio frequency modulation section 1201 have the same structures as those described above. In the following, descriptions regarding an operation of the radio frequency modulation section 1201 will be given.

Like in the power transmitting device 500 in Embodiment 1, the pulse width modulation section 501 sends a PWM pulse to the radio frequency modulation section 1201. The transmitting-side data transfer control section 506 sends FL data to the radio frequency modulation section 1201.

The radio frequency modulation section 1201 includes an oscillator which outputs two frequencies. This structure is used when the FL data transfer is performed by binary values. When the FL data transfer is performed by tertiary values, an oscillator which outputs three frequencies may be used. One oscillator capable outputting a plurality of frequencies may be used, or a plurality of oscillators having different oscillation frequencies may be used.

The output frequency of the oscillator while no FL data is being transferred and while FL data "0" is being transferred is labeled as f0, and the output frequency of the oscillator while FL data "1" is being transferred is labeled as f1. The radio frequency modulation section 1201 switches the output frequency of the oscillator between f0 and f1 in accordance with the value of the FL data sent from the transmitting-side data transfer control section 506. As a result, a radio frequency PWM pulse having a frequency modulated in accordance with the value of the FL data is output.

Figure 14:
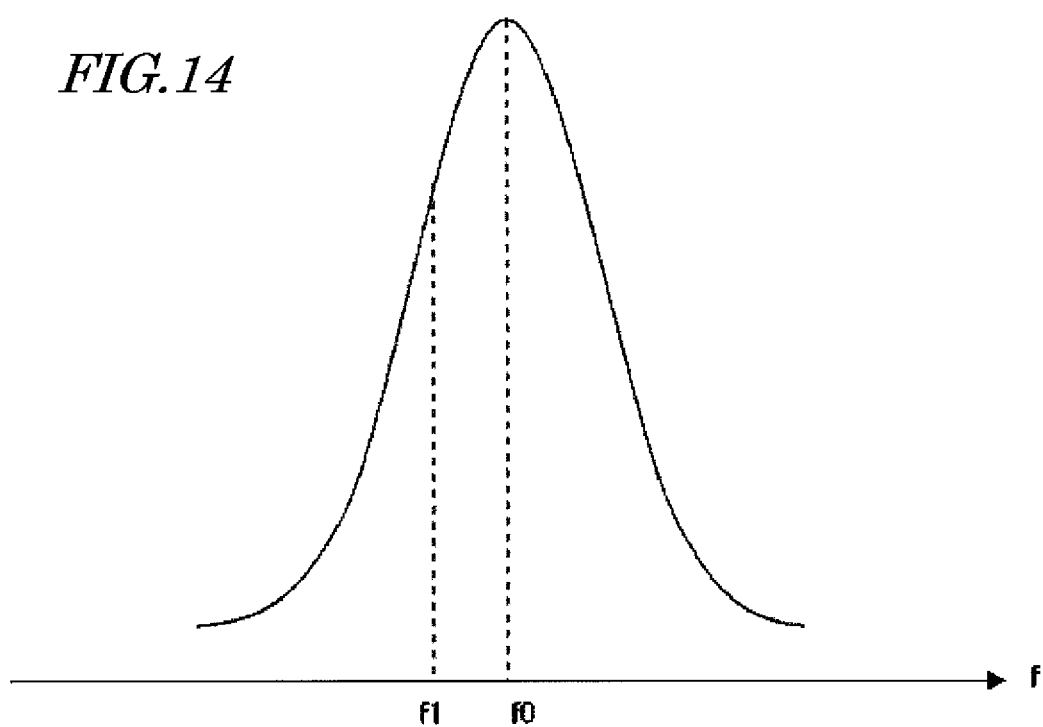
FIG. 14 shows the relationship of oscillation frequencies f0 and f1 with the frequency characteristic of a resonator 104.

FIG. 14 shows the relationship between the output frequencies f0 and f1 of the oscillator and the frequency characteristic (gain) of the resonator 104. As shown in FIG. 14, the output frequency f0 is a frequency close to the peak of the frequency characteristic of the resonator 104, namely, a frequency in the vicinity of the resonance frequency. The output frequency f1 is a frequency slightly shifted from the peak of the frequency characteristic of the resonator 104. When f0 and f1 are set in this manner, the amplitude of the pulse which has passed the resonator 104 is changed in accordance with the frequency characteristic shown in FIG. 14 although the amplitude of the pulse output from the radio frequency modulation section 1201 and the class E amplifier 103 is constant. A reason for this is that the frequency of the post-amplification radio wave PWM pulse is changed in accordance with the value of the FL data.

Owing to the above-described structure, the power transmitting device 1200 can communicate that FL data is "0" or "1" to the power receiving device 600 by changing the amplitude of the pulse. In this case, the correction value calculation section 503 in the power transmitting device 1200 calculates a correction value such that the change of the audio signal level caused by the amplitude change is counteracted, and sends the correction value to the pulse width modulation section 501, like in Embodiment 1. In this embodiment, a power receiving device which is the same as the power receiving device 600 described in Embodiment 1 is usable.

As described above, the power transmitting device 1200 in this embodiment includes the radio frequency modulation section 1201, and changes the oscillation frequency for creating a radio frequency PWM pulse in accordance with the value of the FL data. Owing to such a structure, the amplitude of the post-amplification PWM pulse can be changed without changing the driving voltage Vdd of the class E amplifier 103. In this embodiment, merely an amplifier corresponding to a single driving voltage Vdd is required. Thus, a conventional class E amplifier is usable.

The power transmitting device 1200 in this embodiment performs radio frequency modulation by the radio frequency pulse width modulation section 1201 on the PWM pulse output from the pulse width modulation section 501, and then inputs the modulated PWM pulse to the class E amplifier 103. The present invention is not limited to such a form. For example, the pulse width modulation section 501 may perform both of the pulse width modulation and the radio frequency modulation at the same time or first perform the radio frequency modulation. In such a case, the transmitting-side data transfer control section 506 may instruct the pulse width modulation section 501 to change the frequency.

Figure 15:
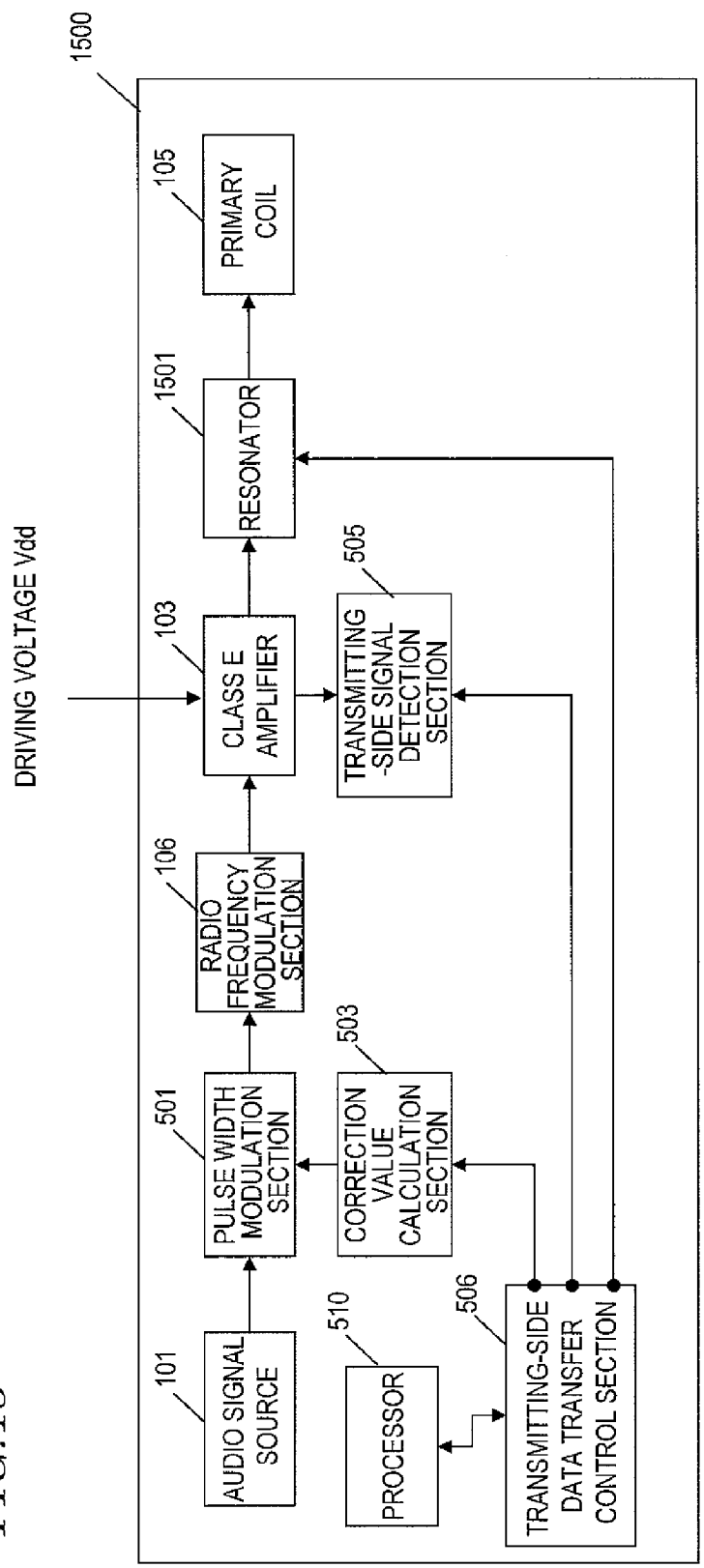
FIG. 15 is a block diagram showing a power transmitting device according to another embodiment.

The power transmitting device 1200 described above performs the amplitude modulation by use of the relationship between the oscillation frequency of the radio frequency modulation section 1201 and the frequency characteristic of the resonator 104. Instead of such a structure, as shown in FIG. 15, the power transmitting device 1500 may include a resonator 1501 including a plurality of resonant circuits having different frequency characteristics and may switch the resonant circuit in accordance with the value of the FL data, while keeping constant the oscillation frequency of the radio frequency modulation section. With such a structure also, substantially the same effect can be provided. Alternatively, the internal structure of the resonator 1501 (value or number of capacitors or inductors, connection form thereof) may be changed in accordance with the value of the FL data to change the frequency characteristic (resonance frequency). Thus, by controlling the resonance frequency of the antenna including the resonator 1501 and the primary coil 105, the similar effect can be achieved.

In Embodiments 1 and 2 described above, it is assumed that the power transmitting device transfers audio data. The data to be transferred does not need to be audio data. It is not indispensable either that the data to be pulse-width-modulated like the above-described audio data should be transferred. In the case where the power transmitting device does not transfer data to be pulse-width-modulated and transfers only the power and the FL data, substantially the same control as described above can be used. In the above description, both of the FL data transfer and the RL data transfer are performed. It is not absolutely necessary that both of these transfers should be performed. The power transmitting device and the power receiving device may be structured such that only the transfer from the power transmitting device to the power receiving device, or only the transfer from the power receiving device to the power transmitting device, is performed.

The present invention is applicable to any electronic device used for wirelessly transferring power. For example, the present invention is applicable to a device such as a wireless speaker or a wireless TV.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2011-103989 filed May 9, 2011, No. 2011-103990 filed May 9, 2011, No. 2012-086775 filed Apr. 5, 2012 and No. 2012-086776 filed Apr. 5, 2012, the entire contents of which are hereby incorporated by reference.

What is claimed is:

1. A power transmitting apparatus usable for wireless power and data transmission, the power transmitting apparatus comprising:

a power transmitting section configured to transmit a pulse train including a plurality of pulses on which power and data to be transmitted are superimposed; and a control section configured to control the power transmitting section such that a change of the power caused by a superimposition of the data is decreased, wherein the control section includes:

a driving voltage control section that changes an amplitude of the pulse train in accordance with a value of the data, a correction value calculation section that calculates a correction value such that, when the amplitude of the pulse train is changed in accordance with the value of the data, the change of the power to be transmitted caused by the change of the amplitude is decreased, and the power transmitting section includes:

a pulse width modulation section that, in accordance with the correction value, changes a pulse width of the pulse train such that the change of the power to be transmitted caused by the change of the amplitude is decreased; and a radio frequency modulation section that modulates the frequency of the pulse train transmitted from the pulse width modulation section, wherein the radio frequency modulation section comprises an oscillation circuit.

2. The power transmitting apparatus of claim 1, wherein the pulse width modulation section, in synchronization with the change of the amplitude, changes a pulse width of the pulse train such that an area size of the pulse train is kept constant.

3. The power transmitting apparatus of claim 1, wherein:
the power transmitting section includes:
the pulse width modulation section further configured to output a first pulse train having a pulse width determined based on an instruction from the control section;
a pulse amplitude modulator configured to output a second pulse train obtained by amplifying the first pulse train as the pulse train; and
a resonator configured to transmit power and data based on the second pulse train; and
the control section is configured to control the pulse width modulation section and the pulse amplitude modulator such that an amplitude and a pulse width of the second pulse train are changed in accordance with the value of the data.

4. The power transmitting apparatus of claim 3, wherein:
the pulse amplitude modulator includes an amplifier configured to amplify the first pulse train with an input driving voltage and thus generating the second pulse train; and
the control section switches the driving voltage to be input to the amplifier in accordance with the value of the data, and thus changes the amplitude of the second pulse train.

5. The power transmitting apparatus of claim 1, wherein:
the power transmitting section includes:
the pulse width modulation section further configured to output a first pulse train having a pulse width determined based on an instruction from the control section;
a pulse amplitude modulator configured to output a second pulse train that has a frequency determined based on an instruction from the control section and is obtained by amplifying the first pulse train, as the pulse train; and
a resonator configured to transmit power and data based on the second pulse train; and
the control section changes a frequency of the first pulse train in accordance with the value of the data, and controls the pulse width modulation section such that a pulse width of the first pulse train is changed.

6. The power transmitting apparatus of claim 5, wherein when the data has a first value, the control section sets the frequency of the first pulse train to a first frequency which is substantially equal to a resonance frequency of the resonator; and when the data has a second value, the control section sets the frequency of the first pulse train to a second frequency that is different from the first frequency.

7. The power transmitting apparatus of claim 1, wherein:
the power transmitting section includes:
the pulse width modulation section further configured to output a first pulse train having a pulse width determined based on an instruction from the control section;
a pulse amplitude modulator configured to output a second pulse train, obtained by amplifying the first pulse train output from the radio frequency modulation section, as the pulse train; and
an antenna including at least one resonator configured to transmit power and data based on the second pulse train; and
the control section controls the antenna such that a resonance frequency is changed and controls the pulse width modulation section such that a pulse width of the first pulse train is changed.

8. The power transmitting apparatus of claim 7, wherein when the data has a first value, the control section sets the resonance frequency to a first frequency that is substantially equal to a frequency of the first pulse train; and when the data has a second value, the control section sets the resonance frequency to a second frequency that is different from the first frequency.

9. The power transmitting apparatus of claim 7, wherein:
the at least one resonator includes a plurality of resonators having different resonance frequencies; and
the control section selects one of the plurality of resonators and thus changes a resonance frequency of the antenna.

10. The power transmitting apparatus of claim 1, wherein when the data is first data, the power transmitting section amplifies second data by means of pulse width modulation and thus converts the power, the first data and the second data into the pulse train and transmits the pulse train.

11. The power transmitting apparatus of claim 10, wherein the control section controls the power transmitting section such that an amplitude and a pulse width of the pulse train are changed in accordance with a value of the first data at a timing at which the second data is not pulse-width-modulated.

12. The power transmitting apparatus of claim 10, wherein the control section controls the power transmitting section such that the power transmitting section performs addition or subtraction of a correction value in accordance with a value of the second data on the pulse width based on the second data and thus determines a pulse width of the pulse train.

13. The power transmitting apparatus of claim 10, wherein while not performing pulse width modulation on the second data, the power transmitting section outputs a synchronization pulse including a first transmission period in which a pulse having a first duty ratio is output and a second transmission period in which a pulse having a second duty ratio is output.

14. The power transmitting apparatus of claim 13, wherein the first duty ratio is 50%, and the second duty ratio is 0%.

15. A wireless power and data transmission system comprising:
a power transmitting apparatus including:
a power transmitting section configured to transmit a pulse train including a plurality of pulses on which power and data to be transmitted are superimposed; and
a control section configured to control the power transmitting section such that a change of the power caused by a superimposition of the data is decreased; and
a power receiving apparatus configured to receive the power and the data transmitted from the power transmitting apparatus, wherein
the control section includes:
a driving voltage control section that changes an amplitude of the pulse train in accordance with a value of the data,
a correction value calculation section that calculates a correction value such that, when the amplitude of the pulse train is changed in accordance with the value of the data, the change of the power to be transmitted caused by the change of the amplitude is decreased, and
the power transmitting section includes:
a pulse width modulation section that, in accordance with the correction value, changes a pulse width of the pulse train such that the change of the power to be transmitted caused by the change of the amplitude is decreased; and a radio frequency modulation section that modulates the frequency of the pulse train transmitted from the pulse width modulation section, wherein the radio frequency modulation section comprises an oscillation circuit.

* * * * *